United States Patent
Kawada

(10) Patent No.: US 6,538,425 B1
(45) Date of Patent: Mar. 25, 2003

(54) METHOD OF MEASURING ACCURACY OF ELECTRIC-COMPONENT MOUNTING SYSTEM

(75) Inventor: Tosuke Kawada, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 157 days.

(21) Appl. No.: 09/721,953

(22) Filed: Nov. 27, 2000

(30) Foreign Application Priority Data

Nov. 29, 1999 (JP) ............................................ 11-337681

(51) Int. Cl.$^7$ ............................................... G01R 31/02
(52) U.S. Cl. ...................... 324/158.1; 324/537; 324/758
(58) Field of Search ............................. 324/158.1, 537, 324/758, 756, 754, 765

(56) References Cited

U.S. PATENT DOCUMENTS

| | | | |
|---|---|---|---|
| 5,408,189 A | * 4/1995 | Swart et al. ................. | 324/758 |
| 5,489,843 A | * 2/1996 | Erjavic et al. ............. | 324/158.1 |
| 5,621,312 A | * 4/1997 | Achor et al. .............. | 324/158.1 |
| 5,621,530 A | * 4/1997 | Marrable, Jr. ................ | 356/394 |
| 5,894,218 A | * 4/1999 | Farnworth et al. ....... | 324/158.1 |
| 5,943,089 A | * 8/1999 | Douglas ....................... | 348/87 |

FOREIGN PATENT DOCUMENTS

| | | |
|---|---|---|
| JP | 2-57719 | 12/1990 |
| JP | 4-344411 | 12/1992 |
| JP | 2824378 | 9/1998 |

* cited by examiner

*Primary Examiner*—N. Le
*Assistant Examiner*—T. R Sundaram
(74) *Attorney, Agent, or Firm*—Oliff & Berridge, PLC

(57) ABSTRACT

A method of measuring an accuracy with which an electric-component mounting system mounts one or more electric components on a circuit substrate, the electric-component mounting system including one or more component holders for holding the electric component or components, a substrate supporting device for supporting the circuit substrate, a first image-taking device for taking an image of at least a portion of the electric component held by the component holder, and a second image-taking for taking an image of at least a portion of the circuit substrate supported by the substrate supporting device, the method including the step of measuring, with the electric-component mounting system, at least one positional error of one of the component holder, the first image-taking device and the second image-taking device relative to one or each of the others of the component holder and the first and second image-taking devices.

27 Claims, 15 Drawing Sheets

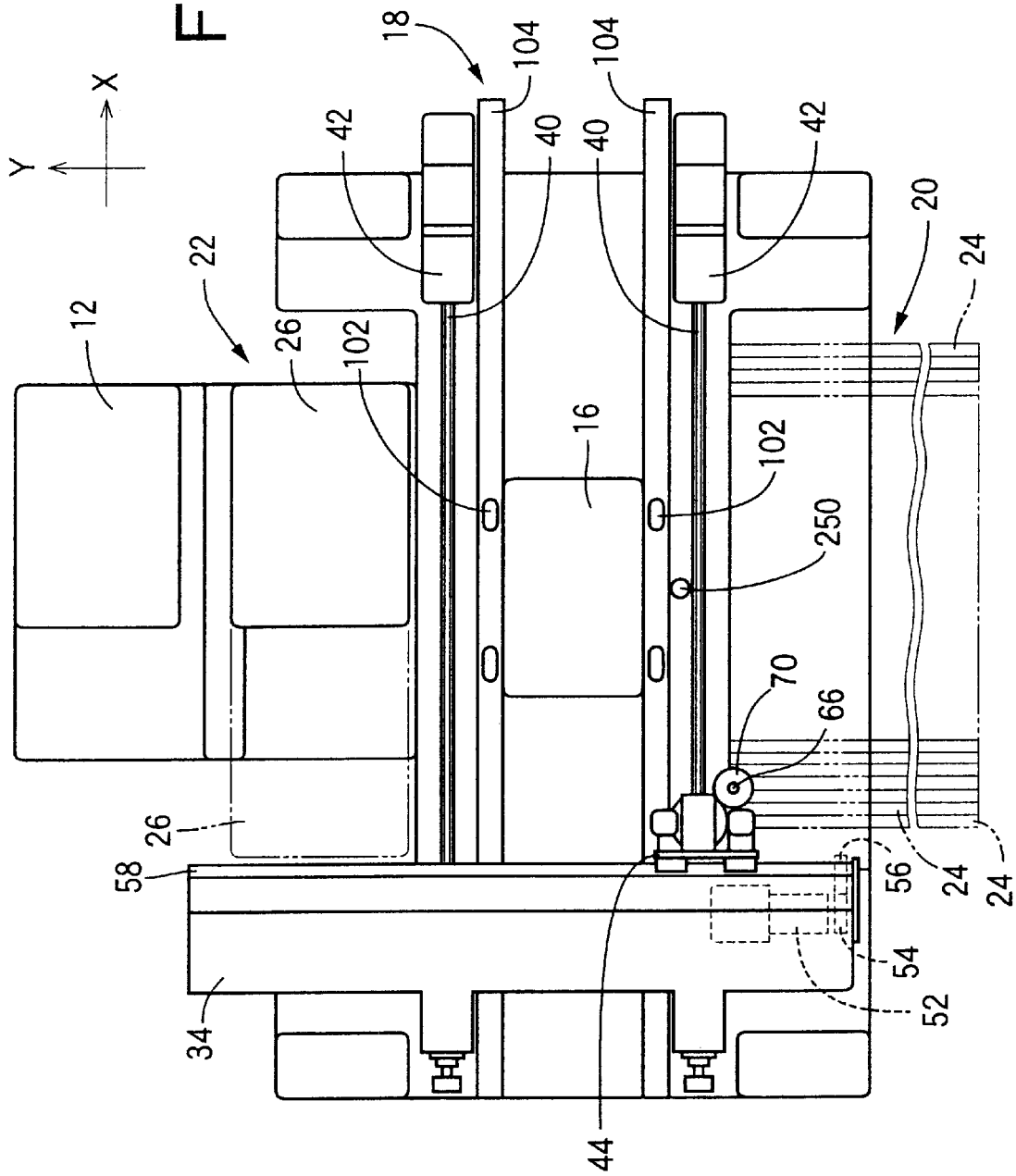

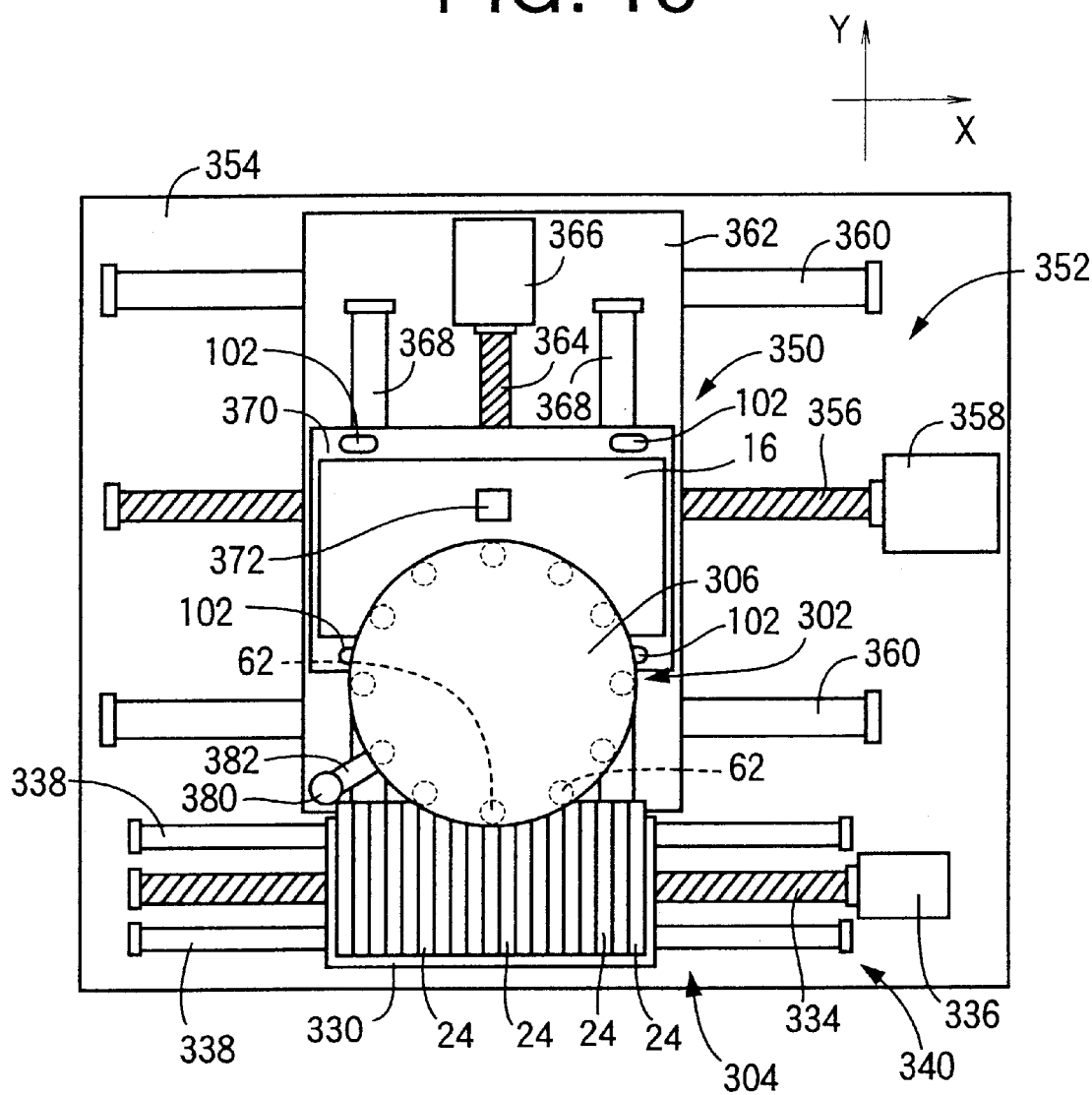

METHOD OF MEASURING ACCURACY OF ELECTRIC-COMPONENT MOUNTING SYSTEM

BACKGROUND OF THE INVENTION

1. Field of the Invention

The present invention relates to a method of measuring a mounting accuracy of an electric-component mounting system which mounts at least one electric component (e.g., an electronic component) on a circuit substrate such as a printed wiring board, and particularly to the art of inspecting a plurality of portions of the mounting system that relate to its mounting accuracy.

2. Discussion of Related Art

Recently, there has been a strong demand to improve a mounting accuracy with which an electric-component (EC) mounting system mounts at least one electric component (EC) on a circuit substrate, so as to meet the need to decrease the distances between the lead wires of each EC and/or the need to increase the density of mounting of ECs. To this end, it has been practiced to detect at least one positional error of one of a plurality of portions of the EC mounting system that relate to its mounting accuracy, relative to the other portion or at least one of the other portions. Those portions include an EC holder which holds an EC, a first image taking device which takes an image of the EC held by the EC holder, and a second image taking device which takes an image of a reference mark of a circuit substrate on which the EC is to be mounted. Based on the detected positional error, the EC mounting system controls its EC mounting operation. In the conventional accuracy measuring method, a special measuring device is employed to measure the positional error on the EC mounting system, and the thus measured positional error is used to adjust the mounting system, when the system is manufactured or when the system is subjected to maintenance by user.

That is, the conventional accuracy measuring method needs the special measuring device to measure the positional error from the EC mounting system, and accordingly the user cannot easily measure the error.

Meanwhile, the positional error with the EC mounting system may change because of the deformation of the mounting system as a whole that is caused by the change of temperature of ambient air or by the increase of temperature resulting from the heat generation of one or more servomotors and/or the friction of one or more ball screws. The change of positional error may also be caused by the wearing and/or deformation of one or more parts of the mounting system. Thus, the improvement of mounting accuracy of the EC mounting system needs to measure frequently the positional error from the mounting system and adapt the system to the changes of the positional error. However, in the conventional accuracy measuring method and apparatus, a plurality of positional errors are measured in a plurality of measuring actions (ideally, several tens of measuring actions) in each one positional-error measuring operation, and an average of those errors is obtained to minimize the error of measurement. This means that it is difficult to perform frequently the positional-error measuring operations and adapt the mounting system to the changes of the positional error.

Moreover, in the conventional accuracy measuring method, a characteristic value of the EC mounting system that is obtained as a value relating to its mounting accuracy is treated as if it were constant. More specifically described, a plurality of characteristic values of the EC mounting system are measured in a plurality of measuring actions, and an average of those characteristic values is obtained as a proper characteristic value of the mounting system. However, the proper characteristic value of the mounting system that is obtained once is used as if it were constant till the next positional-error measuring operation is carried out to update the proper characteristic value. In fact, the proper characteristic value changes as the EC mmounting operation of the EC mounting system progresses or as the amount of operation of the mounting system increases.

SUMMARY OF THE INVENTION

The present invention provides an accuracy measuring method, an accuracy-measuring-program recording medium, and an electric-component mounting system which have one or more of the following technical features that are described below in respective paragraphs given parenthesized sequential numbers (1) to (25). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a method of measuring an accuracy with which an electric-component mounting system mounts at least one electric component on a circuit substrate, the electric-component mounting system including at least one component holder for holding the at least one electric component, a substrate supporting device for supporting the circuit substrate, a first image-taking device for taking an image of at least a portion of the electric component held by the component holder, and a second image-taking device for taking an image of at least a portion of the circuit substrate supported by the substrate supporting device, at least two elements out of the component holder, the first image-taking device and the second image-taking device relating to the accuracy, the method comprising the step of measuring, with the electric-component mounting system, at least one positional error of one of the component holder, the first image-taking device and the second image-taking device relative to at least one of the others of the component holder and the first and second image-taking devices.

In the present accuracy measuring method, the mounting accuracy of the EC mounting system is measured with the mounting system itself. Thus, the mounting accuracy can be easily measured and accordingly can be measured frequently. That is, the deformation of the mounting system as a whole that is caused by the change of temperature of ambient air, the heat generation of one or more servomotors, the increase of temperature resulting from the friction of one or more ball screws, etc. can be detected frequently, which leads to improving the mounting accuracy of the mounting system. The first and second image-taking devices may be provided by a single image-taking device. The above-indicated at least one positional error may comprise at least one of (a) at least one positional error of an axis line of one of the component holder and the first and second image-taking devices relative to an axis line of at least one of the others of the component holder and the first and second image-taking devices (e.g., as seen in at least one of an X-axis direction and a Y-axis direction) and (b) a phase or angular error (i.e., a rotation-position error) of an axis line of one of the component holder and the first and second image-taking devices relative to an axis line of at least one of the others of the component holder and the first and second image-taking devices.

(2) According to a second feature of the present invention, there is provided a method of measuring an accuracy with which an electric-component mounting system mounts at least one electric component on a circuit substrate, the electric-component mounting system including at least one component holder for holding the at least one electric component, a substrate supporting device for supporting the circuit substrate, a first image-taking device for taking an image of at least a portion of the electric component held by the component holder, and a second image-taking device for taking an image of at least a portion of the circuit substrate supported by the substrate supporting device, at least two elements out of the component holder, the first image-taking device and the second image-taking device relating to the accuracy, the method comprising the steps of operating the component holder to hold a standard chip, operating the first image-taking device to take at least one first image of at least a portion of the standard chip held by the component holder, operating the component holder to place the standard chip at a prescribed chip-place position, operating the second image-taking device to take at least one second image of at least a portion of the standard chip placed at the chip-place position, and determining, based on the first image taken by the first image-taking device and the second image taken by the second image-taking device, at least one positional error of one of the component holder, the first image-taking device and the second image-taking device relative to at least one of the others of the component holder and the first and second image-taking devices.

In the present accuracy measuring method, both the image of the standard chip held by the component holder and the image of the same chip placed at the chip-place position are taken and, through the medium of the standard chip, the positional error of one of the component holder and the first and second image-taking devices relative to at least one of the others of the component holder and the first and second image-taking devices is measured. Thus, the positional error of one of a plurality of portions of the EC mounting system that relate to its mounting accuracy, relative to at least one of the others of those portions is measured by utilizing the proper functions of the mounting system itself. Thus, the present method does not need such a special jig which is employed in the previously-described conventional method. The standard chip may be one which is manufactured exclusively for measurement purposes only, or one of the proper electric components to be mounted on the circuit substrates. As will be described in DETAILED DESCRIPTION OF PREFERRED EMBODIMENTS, in the case where the change of the relative position between the component holder and the second image-taking device is negligibly small and accordingly the relative position can be regarded as being constant, or in the case where the relative position between the component holder and the second image-taking device is measured in advance and is known already, the present method does not essentially need to determine the position of the component holder. In addition, some error of the actual position of the component holder from its reference or nominal position may not influence the mounting accuracy of the EC mounting system, so long as the component holder can reliably hold the EC. In the last case, too, the present method does not essentially need to determine the actual position of the component holder. The EC mounting system may be one which includes a component holder for holding an EC, and a moving device for moving the holder in directions parallel to an upper surface of a circuit substrate, so that the holder mounts the EC on the substrate; or one which has a fixed EC-mount position where a component holder mounts an EC on a circuit substrate and which includes a substrate supporting device for supporting the substrate and a moving device for moving the substrate supporting device supporting the substrate, in directions parallel to an upper surface of the substrate, so that the holder mounts the EC on the substrate at the fixed EC-mount position.

(3) According to a third feature of the present invention that includes the second feature (2), the step of determining the at least one positional error comprises determining, based on the first image taken by the first image-taking device, at least one positional error of the standard chip held by the component holder, relative to at least one of the component holder and the first image-taking device, and determining, based on the second image taken by the second image-taking device, at least one positional error of the second image-taking device relative to the standard chip placed at the chip-place position.

The determining steps according to this feature are a representative manner of the determining step according to the second feature (2).

(4) According to a fourth feature of the present invention that includes the second or third feature (2) or (3), the step of determining the at least one positional error comprises determining at least one positional error of the second image-taking device relative to at least one of the component holder and the first image-taking device.

The second image-taking device takes the image of the circuit substrate, and the EC mounting system determines, based on the taken image, a position where the EC held by the component holder is to be mounted on the circuit substrate. Accordingly, it is preferable to measure a positional error of the second image-taking device relating to the position on the circuit substrate, relative to the component holder or the first image-taking device relating to the position of the EC. In particular, in the case where the positional error between the first and second image-taking devices is measured, the mounting accuracy of the EC mounting system can be easily improved.

(5) According to a fifth feature of the present invention that includes any one of the second to fourth features (2) to (4), the step of determining the at least one positional error comprises determining at least one positional error of the standard chip relative to the component holder, and modifying, based on the determined positional error of the standard chip relative to the component holder, prescribed control data used to operate the component holder to place the standard chip at the prescribed chip-place position, so that the component holder is operated, according to the modified control data, to place the standard chip at the chip-place position.

In the present accuracy measuring method, the positional error of the standard chip relative to the component holder is determined, and the thus determined error is used to modify the prescribed control data according to which the component holder is operated to place the standard chip at the prescribed chip-place position, as is done in the case where the component holder is operated to mount the EC on the circuit substrate. According to the thus modified control data, the component holder is operated to place the standard chip at the chip-place position. Therefore, the present method can measure an overall mounting accuracy of all the portions of the EC mounting system that relate to its EC-mounting function. However, it is possible to place the standard chip without modifying the control data based on the positional error of the chip relative to the holder. In the latter case, the present method can measure a mounting accuracy of only the portions of the EC mounting system that relate to its EC-mounting function but do not include one or more portions relating to the function of modifying the control data based on the positional error of the chip relative to the holder. The above-described two sorts of mounting accuracies may be measured and a difference of the two accuracies may be obtained. This difference means an accuracy of the one or more portions of the mounting system that relate to the function of modifying the control data based on the positional error of the chip relative to the holder.

(6) According to a sixth feature of the present invention that includes any one of the second to fifth features (2) to (5), the step of measuring the at least one positional error further comprises placing, before the component holder is operated to hold the standard chip, the standard chip at the prescribed chip-place position, so that the component holder is operated to hold the standard chip placed at the chip-place position.

The standard chip may be supplied by a special supplying device each time a mounting-accuracy measuring operation is carried out. In this case, however, the present method need an additional step of removing the standard chip after use. This leads to complicating the measuring operation of the EC mounting system. In contrast, in the present accuracy measuring method, the standard chip is placed, in advance, at the prescribed chip-plate position. Therefore, the mounting system has only to repeat taking up the standard chip from the chip-place position and returning it to the same place, and does not need the special step of removing the used chip, which leads to simplifying the mounting-accuracy measuring operation of the mounting system. In addition, the present method needs only a small amount of standard chips and does not need a special standard-chip supplying device.

(7) According to a seventh feature of the present invention that includes any one of the second to sixth features (2) to (6), the step of operating the first image-taking device to take the at least one first image comprises rotating the component holder holding the standard chip, about an axis line of the holder, to each of a plurality of rotation positions of the holder, and operating the first image-taking device to take a first image of the standard chip held by the component holder at each of the rotation positions thereof, and wherein the step of determining the at least one positional error comprises determining, based on the respective first images taken by the first image-taking device at the rotation positions of the holder, at least one positional error of the standard chip relative to the component holder.

When the EC is mounted on the circuit substrate, it is assumed that the position of the component holder present in the first image taken by the first image-taking device is constant or unchangeable, and a positional error of the position of a predetermined portion (e.g., the center) of the EC relative to the constant position of the holder, determined by the processing of the first image, is obtained as a positional error of the EC relative to the holder. When the mounting accuracy of the EC mounting system is measured, it is also possible to determine a positional error of the standard chip relative to the component holder in the same manner as described above for the case where the EC is mounted on the substrate. In the latter case, however, if the actual position of the holder in the first image is deviated from its reference or nominal position, that deviation cannot be detected. In contrast, in the present accuracy measuring method, the component holder is rotated to rotate the standard chip to each of a plurality of rotation positions where respective images of the standard chip are taken and based on the thus taken images, the center of rotation of the standard chip is determined. This center can be determined as the actual position of the holder, and at least one positional error of the standard chip relative to the position of the holder can be accurately measured.

(8) According to an eighth feature of the present invention that includes the seventh feature (7), the step of determining the at least one positional error of the standard chip relative to the component holder comprises determining, as a position of the component holder, a position of a center of a circle which passes through respective positions of respective centers of the standard chips present in the respective first images taken by the first image-taking device at the rotation positions of the holder.

(9) According to a ninth feature of the present invention that includes the seventh or eighth feature (7) or (8), the plurality of rotation positions of the component holder are equiangularly spaced from each other about the axis line of the holder, and the step of determining the at least one positional error of the standard chip relative to the component holder comprises determining, as a position of the component holder, an average of respective positions of respective centers of the standard chips present in the respective first images taken by the first image-taking device at the rotation positions of the holder.

In the present accuracy measuring method, the position of the component holder can be determined by calculating the average of the respective center positions of the standard chips present in the first images taken. Thus, the positional error between the holder and the chip can be easily determined. As the incremental angle by which the holder is intermittently rotated decreases, the total number of the respective center positions of the standard chips increases, which leads to improving the accuracy of determination of the center position of the holder. However, the total number of image-taking actions and the total amount of processing of the taken images increase and accordingly the overall time needed for each mounting-accuracy measuring operation increases. Therefore, it is preferred that the incremental angle be 90 degrees

(10) According to a tenth feature of the present invention, there is provided a method of measuring an accuracy with which an electric-component mounting system mounts at least one electric component on each of a plurality of circuit substrates, the electric-component mounting system including at least one component holder for holding the at least one electric component, a substrate supporting device for supporting the each of the circuit substrates such that the each circuit substrate is not movable relative thereto, and a moving device for moving the component holder holding the electric component, in a direction parallel to a surface of the each circuit substrate supported by the substrate supporting device, so that the electric component is mounted on the each circuit substrate, the method comprising the step of measuring, while the electric-component mounting system is performing an electric-component mounting operation, the accuracy with which the mounting system mounts the at least one electric component on the each of the circuit substrates, by using at least one portion of the mounting system that can be used without lowering an operation efficiency with which the mounting system performs the electric-component mounting operation.

The present accuracy measuring method can measure, while the EC mounting system is performing the EC mounting operation, the mounting accuracy of the mounting system, without lowering the operation efficiency thereof.

(11) According to an eleventh feature of the present invention that includes the tenth feature (10), the step of measuring the accuracy comprises operating, after the electric-component mounting system has finished, in the electric-component mounting operation, a mounting operation on a first circuit substrate supported by the substrate supporting device and while the mounting system is continuing the electric-component mounting operation including carrying out the first circuit substrate from the substrate supporting device and carrying in a second circuit substrate to the supporting device, the component holder to hold a standard chip and place the standard chip at a prescribed chip-place position, and determining at least one positional error of the standard chip placed at the chip-place position.

While a first circuit substrate is carried out and a second circuit substrate is carried in, the component holder or the first or second image-taking device is not used. This is utilized by the present accuracy measuring method to measure the mounting accuracy of the EC mounting system. Therefore, even while the mounting system is performing the EC mounting operation, the mounting accuracy of the system can be measured without lowering the operation efficiency thereof. In the EC mounting system of the type in which the component holder is moved in directions parallel to surfaces of the circuit substrate to mount the EC on the substrate, if the chip-place position is prescribed at a position which is not on the substrate and where the standard chip does not interfere with the movable parts of a substrate conveying device or the substrate being conveyed thereby, the component holder can be operated to place the chip at the chip-place position, either when the substrate is carried in or out or when the substrate is kept still.

(12) According to a twelfth feature of the present invention that includes the tenth or eleventh feature (10) or (11), the chip-place position is prescribed at a position on the substrate supporting device such that the standard chip placed at the prescribed chip-place position does not interfere with the circuit substrate supported by the substrate supporting device.

In the present accuracy measuring method, the chip-place position is prescribed at a position which is on the substrate supporting device and where the standard chip does not interfere with the circuit substrate. Therefore, both the mounting-accuracy measuring operation and the EC mounting operation can be carried out without interfering with each other. For example, in the state in which the standard chip is placed at the chip-place position, the EC mounting operation can be carried out.

(13) According to a thirteenth feature of the present invention that includes any one of the tenth to twelfth features (10) to (12), the chip-place position is prescribed at a position on a portion of the substrate supporting device that is immovable at least while the electric-component mounting system is performing the electric-component mounting operation.

If the chip-place position is prescribed or predetermined at a position on a movable member of the substrate supporting device, the standard chip which is placed at the chip-place position might be moved when the movable member is accelerated or decelerated. In contrast, since the chip-place position is prescribed on the immovable portion of the supporting device, the present accuracy measuring method is free of that problem. The chip-place position is prescribed within the range which can be covered by the field of view of the second image-taking device.

(14) According to a fourteenth feature of the present invention, there is provided a method of measuring an accuracy with which an electric-component mounting system mounts at least one electric component on each of a plurality of circuit substrates, the electric-component mounting system including at least one component holder for holding the at least one electric component and mounting the electric component on the each of the circuit substrates, the method comprising the steps of measuring, at each one of a plurality of different times, at least one temporary characteristic value relating to the accuracy with which the electric-component mounting system mounts the at least one electric component on the each circuit substrate; and determining, at the each one of the different times, at least one proper characteristic value based on the at least one temporary characteristic value measured at the each one time and at least one temporary characteristic value measured at at least one of the different times that is prior to the each one time.

The characteristic value of the EC mounting system may be a positional error of a portion of the mounting system relative to another portion of the same. In the present accuracy measuring method, since a plurality of temporary characteristic values are measured, the influence of error of measurement to the proper characteristic value can be gradually reduced, and accordingly the proper characteristic value gradually approaches a true characteristic value of the system. In addition, since the plurality of temporary characteristic values are obtained at substantially different times and are utilized on an accumulative basis, the present method can reliably follow the change of the true characteristic value that may occur as the EC mounting operation progresses or as the total amount of operation of the mounting system increases. The present method may be carried out by the EC mounting system itself, or a special, accuracy measuring apparatus which does not belong to the mounting system and measures a mounting accuracy of the mounting system. A new proper characteristic value at the current time may be determined by correcting the proper characteristic value determined at the last time, with a temporary characteristic value measured at the current time, such that the new proper characteristic value is a value between the last proper characteristic value and the current temporary characteristic value. The new proper characteristic value may be any value between the last proper characteristic value and the current temporary characteristic value. In the case where the new proper characteristic value is determined as an internal-division point between the last proper characteristic value and the current temporary characteristic value, the internal-division point may be determined using a predetermined internal-division ratio. Alternatively, the internal-division point may be changed using the total number of times by which the proper characteristic value has been corrected, as recited in the sixteenth feature (16). The internal-division ratio should be determined depending upon how to weigh one of the last proper characteristic value and the current temporary characteristic value relative to the other characteristic value. For example in the case where it is speculated that the change of the true characteristic value will be small, the last proper characteristic value should be weighed more than the current temporary characteristic value.

(15) According to a fifteenth feature of the present invention that includes the fourteenth feature (14), the step of measuring the at least one temporary characteristic value comprises measuring the at least one temporary characteristic value, at the each one time after the electronic-component mounting system has finished a mounting operation on a first circuit substrate and before the mounting system starts a mounting operation on a second circuit substrate following the first circuit substrate.

Between two successive times at which two successive proper characteristic values are determined, respectively, one or more mounting operations on one or more circuit substrates are carried out using the prior one of the two proper characteristic values, i.e., the last proper characteristic value. The total number of temporary characteristic value or values measured at each time may be one or plural. However, such a total number is preferable which can be obtained without lowering the operation efficiency of the EC mounting system. The present accuracy measuring method can reliably follow the change of the true characteristic value which may occur as the EC mounting operation of the EC mounting system progresses or as the total amount of use of the mounting system increases.

(16) According to a sixteenth feature of the present invention that includes the fourteenth or fifteenth feature (14) or (15), the step of determining the at least one proper characteristic value comprises determining, at the each one of the times, the at least one proper characteristic value based on the at least one temporary characteristic value measured at the each one time, at least one proper characteristic value determined at one of the different times that precedes the each one time, and a total number of the different times up to the each one time.

In the present accuracy measuring method, for example, the new proper characteristic value is determined while the above-described internal-division ratio is changed depending upon the total number of the different times up to the current time. The manner in which the internal-division ratio is changed depending upon the total number may be such, that while the total number is small, the new proper characteristic value is a value between the last proper characteristic value and the current temporary characteristic value and nearer to the latter value and, as the total number increases, the new proper characteristic value gradually approaches the last proper characteristic value, or vice versa.

(17) According to a seventeenth feature of the present invention that includes any one of the first to ninth features (1) to (9), the step of measuring the at least one positional error comprises measuring, while the electric-component mounting system is performing an electric-component mounting operation, the at least one positional error of the one of the component holder and the first and second image-taking devices relative to the at least one of the others of the component holder and the first and second image-taking devices, by using a plurality of portions of the mounting system that can be used without lowering an operation efficiency with which the mounting system performs the electric-component mounting operation, the plurality of portions of the mounting system comprising the component holder and the first and second image-taking devices.

The present accuracy measuring method may employ any one of the above-described eleventh to thirteenth features (11) to (13).

(18) According to an eighteenth feature of the present invention that includes any one of the fourteenth to sixteenth features (14) to (16), the step of measuring the at least one temporary characteristic value comprises measuring, while the electric-component mounting system is performing an electric-component mounting operation, the at least one temporary characteristic value, by using at least one portion of the mounting system that can be used without lowering an operation efficiency with which the mounting system performs the electric-component mounting operation, the at least one portion of the mounting system comprising the component holder.

The present accuracy measuring method may employ any one of the above-described eleventh to thirteenth features (11) to (13).

(19) According to a nineteenth feature of the present invention that includes any one of the first to ninth features (1) to (9), the step of measuring the at least one positional error comprises measuring, at each one of a plurality of different times, at least one temporary characteristic value relating to the accuracy, and determining, at the each one of the different times, at least one proper characteristic value based on the at least one temporary characteristic value measured at the each one time and at least one temporary characteristic value measured at at least one of the different times that is prior to the each one time.

The present accuracy measuring method may employ any one of the eleventh to thirteenth features (10) to (13) and the fifteenth and sixteenth features (15), (16).

(20) According to a twentieth feature of the present invention that includes any one of the first to ninth features (1) to (9), the step of measuring the at least one positional error comprises measuring, at each one of a plurality of different times while the electric-component mounting system is performing an electric-component mounting operation, at least one temporary characteristic value comprising the at least one positional error of the one of the component holder and the first and second image-taking devices relative to the at least one of the others of the component holder and the first and second image-taking devices, by using a plurality of portions of the mounting system that can be used without lowering an operation efficiency with which the electric-component mounting system performs the electric-component mounting system, and determining, at the each one of the different times, at least one proper characteristic value based on the at least one temporary characteristic value measured at the each one time and at least one temporary characteristic value measured at at least one of the different times that is prior to the each one time, the plurality of portions of the mounting system comprising the component holder and the first and second image-taking devices.

The present accuracy measuring method may employ any one of the eleventh to thirteenth features (11) to (13) and the fifteenth and sixteenth features (15), (16).

(21) According to a twenty-first feature of the present invention that includes any one of the second to twentieth features (2) to (20), the step of measuring the at least one positional error further comprises prescribing a plurality of chip-place positions which are distant from each other in a direction which is parallel to a surface of the circuit substrate supported by the substrate supporting device and in which a moving device moves at least one of the component holder and the circuit substrate relative to the other of the component holder and the circuit substrate.

The present method can measure, for each of the plurality of chip-place positions, the accuracy with which the moving device positions the component holder and the circuit substrate relative to each other. It is preferred that the plurality of chip-place positions be uniformly distributed over the entirety of the range in which the moving device can cause the relative movement of the holder and the substrate.

(22) According to a twenty-second feature of the present invention, there is provided a method of measuring an accuracy with which an electric-component mounting system mounts at least one electric component on a circuit substrate, the electric-component mounting system including at least one component holder for holding the at least one electric component, a substrate supporting device for supporting the circuit substrate, a first image-taking device for taking an image of at least a portion of the electric component held by the component holder, and a second image-taking device for taking an image of at least a portion of the circuit substrate supported by the substrate supporting device, the method comprising the steps of operating the component holder to hold a standard chip, operating the first image-taking device to take at least one first image of at least a portion of the standard chip held by the component holder, operating the component holder to place the standard chip at a prescribed chip-place position, operating the second image-taking device to take at least one second image of at least a portion of the standard chip placed at the chip-place position, determining, based on image data representing the first image taken by the first image-taking device and image data representing the second image taken by the second image-taking device, a relative angular error between respective angular phases of the first and second image-taking devices about respective optical axes thereof.

The relative angular error between the respective angular phases of the first and second image-taking devices can be determined without requiring essentially that the relative position of the component holder and the first image-taking device be unchangeable, or that the relative positional error between the holder and the first image-taking device be measured. The present measuring method may employ any one of the above-described second to twenty-first features (2) to (21).

(23) According to a twenty-third feature of the present invention, there is provided a recording medium in which an accuracy measuring program is recorded such that the accuracy measuring program is readable by a computer to control an electric-component mounting system to measure an accuracy with which the mounting system mounts at least one electric component on a circuit substrate, the mounting system including at least one component holder for holding the electric component and mounting the electric component on the circuit substrate, the accuracy measuring program comprising the steps of controlling the component holder to hold a standard chip, controlling a first image-taking device to take at least one first image of at least a portion of the standard chip held by the component holder, moving the component holder to a prescribed chip-place position and place the standard chip at the chip-place position, controlling a second image-taking device to take at least one second image of at least a portion of the standard chip placed at the chip-place position, determining, based on image data representing the first image taken by the first image-taking device, at least one first relative positional error between the standard chip and at least one of the component holder and the first image-taking device, and determining, based on image data representing the second image taken by the second image-taking device, at least one second relative positional error between the standard chip and the second image-taking device.

The present measuring method may employ any one of the above-described second to twenty-second features (2) to (22). When the accuracy-measuring program recorded on the present recording medium is used with a computer of a conventional EC mounting system, the mounting system can automatically measure a mounting accuracy or error of its own.

(24) According to a twenty-fourth feature of the present invention that includes the twenty-third feature (23), the accuracy measuring program further comprises modifying, based on the determined first and second relative positional errors, an electric-component mounting program which is used to control the electric-component mounting system to mount the electric component on the circuit substrate.

In this case, the mounting error of the EC mounting system can be automatically removed or reduced.

(25) According to a twenty-fifth feature of the present invention, there is provided an electric-component mounting system, comprising at least one component holder which is for holding at least one electric component and mounting the electric component on a circuit substrate; a moving device which is for moving at least one of the component holder and the circuit substrate relative to the other of the component holder and the circuit substrate, in a direction parallel to a surface of the circuit substrate; a first image-taking device which is for taking an image of at least a portion of the electric component held by the component holder; a second image-taking device which is for taking an image of at least a portion of the circuit substrate; and a control device which controls the component holder, the moving device, and the first and second image-taking devices so that the electric component is mounted on the circuit substrate, the control device comprising a measurement control portion which controls the component holder to hold a standard chip, controls the first image-taking device to take at least one first image of at least a portion of the standard chip held by the component holder, controls the component holder to place the standard chip at a prescribed chip-place position, controls the second image-taking device to take at least one second image of at least a portion of the standard chip placed at the chip-place position, determines, based on image data representing the first image taken by the first image-taking device, at least one first relative positional error between the standard chip and at least one of the component holder and the first image-taking device, and determines, based on image data representing the second image taken by the second image-taking device, at least one second relative positional error between the standard chip and the second image-taking device.

The present EC mounting system may employ any one of the above-described second to twenty-fourth features (2) to (24).

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 14 is a plan view corresponding to FIG. 3 and showing another EC mounting system as a fourth embodiment of the present invention; and FIG. 15 is a plan view of another EC mounting system as a fifth embodiment of the present invention.

DETAILED DESCRIPTION OF PREFERRED EMBODIMENTS

Figure 1:
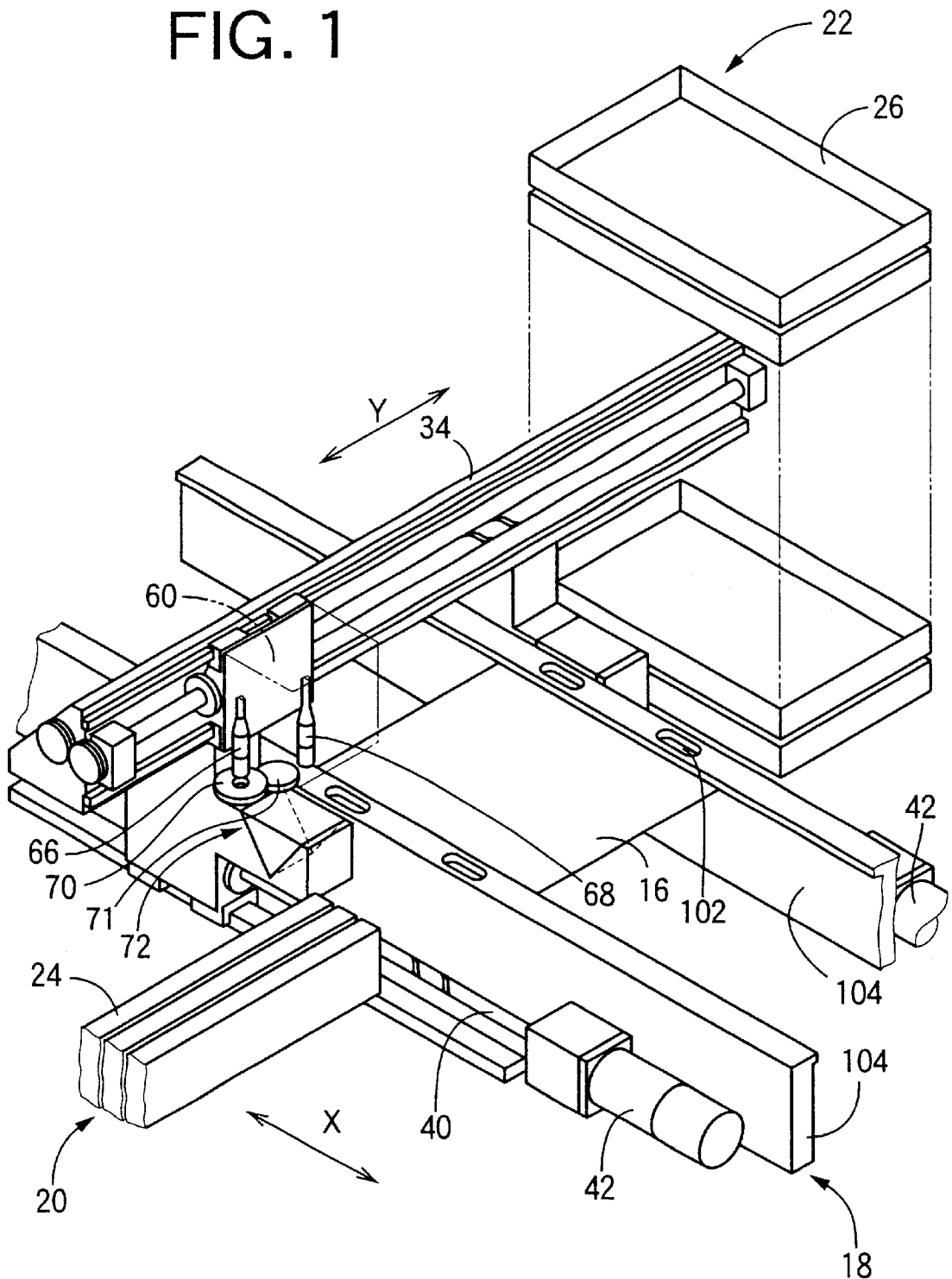
FIG. 1 is a perspective view of an electric-component (EC) mounting system to which the present invention is applied.
Figure 2:
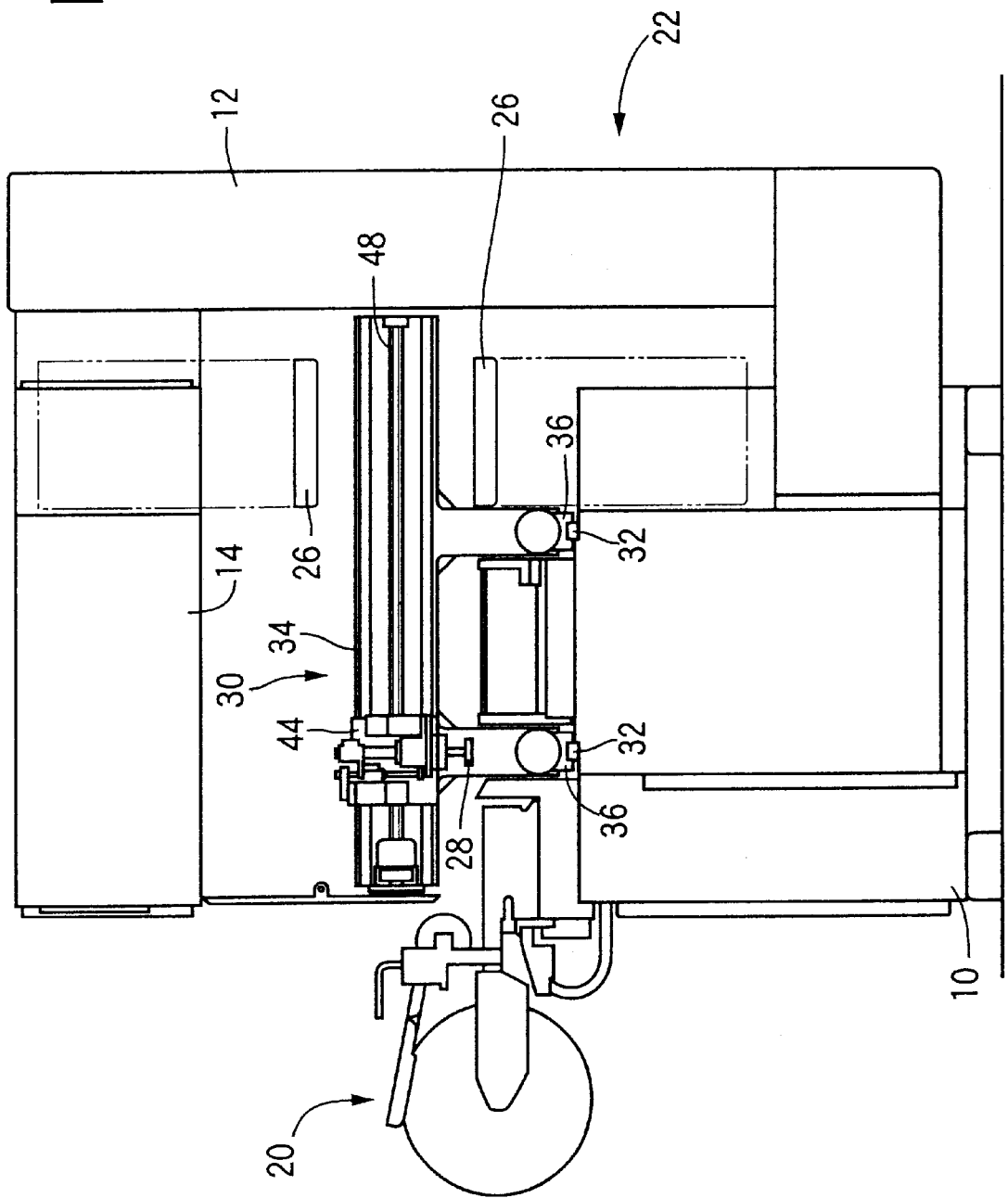
FIG. 2 is a side elevation view of the system of FIG. 1.
Figure 3:
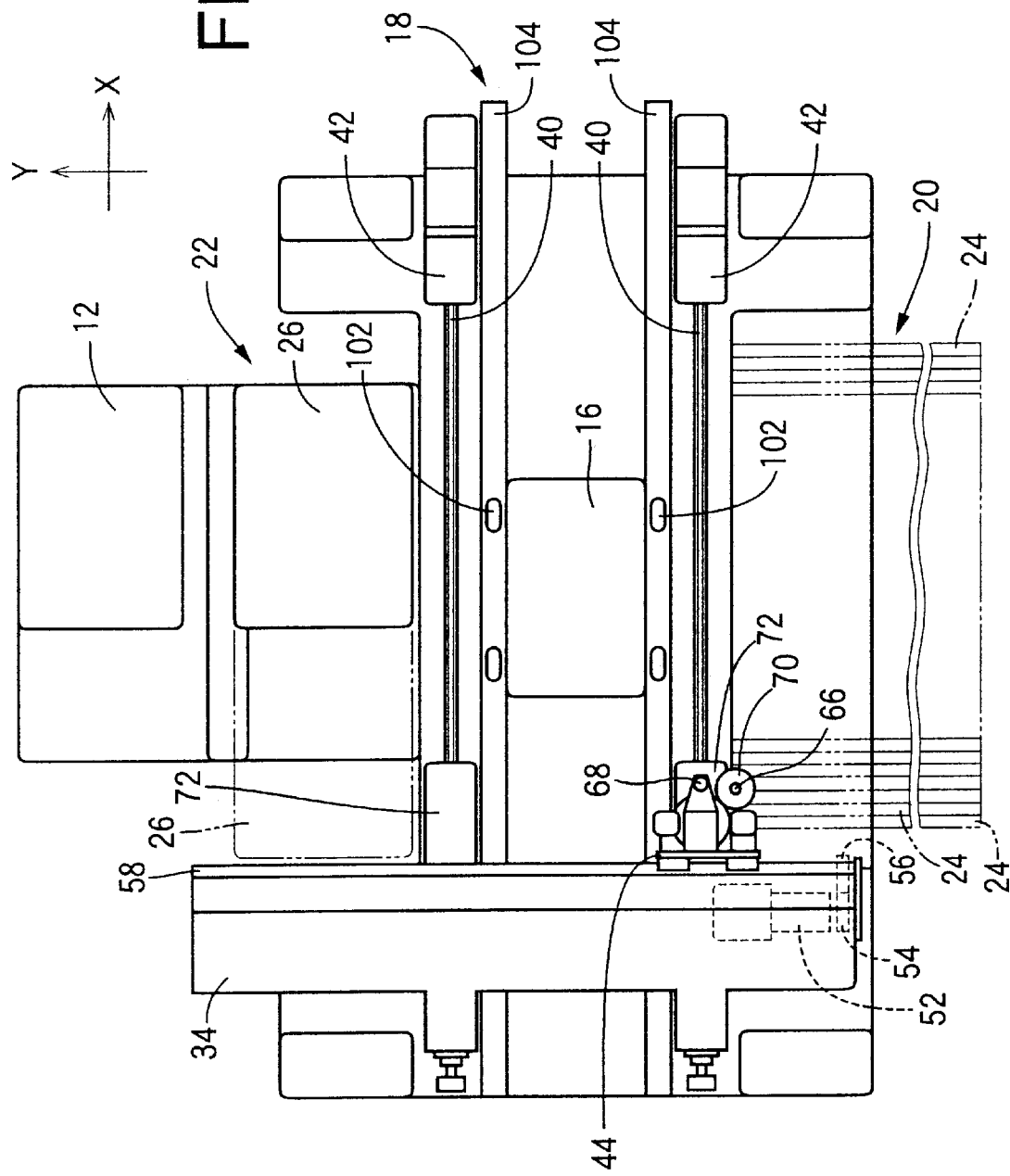
FIG. 3 is a plan view of the system of FIG. 1.

An electric-component (EC) mounting system to which the present invention is applied is shown in FIGS. 1, 2 and 3. The present EC mounting system has the same basic construction as that of the system disclosed in Japanese Patent No. 2,824,378. Here, a general construction of the EC mounting system is briefly described, and only relevant portions of the same are described in detail, later.

In FIG. 2, reference numeral 10 designates a base, on which a plurality of columns 12 stand. A stationary frame 14 is fixed to the columns 12, and supports an operation panel, etc. As shown in FIG. 3, on the bed 10, there is also provided a board conveyor 18 which conveys a printed board 16 as a circuit substrate in an X-axis direction as indicated at arrow in FIGS. 1 and 3. The term "printed board" is used to refer both a printed "wiring" board on which no ECs have been mounted, and a printed "circuit" board on which ECs have been mounted. The printed board 16 which is conveyed by the board conveyor 18 is positioned and supported at a prescribed position by a board positioning and supporting device (not shown) such that the printed board 16 is not movable relative thereto.

As shown in FIGS. 1 and 3, a feeder-type EC supplying device 20 and a tray-type EC supplying device 22 are provided on both sides of the board conveyor 18 in a Y-axis direction perpendicular to the X-axis direction on a horizontal plane. The feeder-type EC supplying device 20 includes a number of feeders 24 which are arranged in the X-axis direction. Each feeder 24 feeds an EC carrier tape. The EC carrier tape includes an EC accommodating tape which has a number of EC accommodating pockets arranged at a regular interval of distance in a lengthwise direction thereof and carries a number of ECs accommodated in the pockets, respectively; and a cover tape which is adhered to the accommodating tape to close respective openings of the pockets thereof, so that at the time of feeding of the EC carrier tape, the ECs are prevented from jumping out of the pockets. Each feeder 24 feeds the EC carrier tape at a predetermined pitch in the Y-axis direction, while peeling the cover tape from the EC accommodating tape. Thus, each EC is fed to an EC-supply position on the each feeder 24.

The tray-type EC supplying device 22 includes a number of trays each of which holds a plurality of ECs. As shown in FIG. 1, the supplying device 22 includes a number of tray accommodating boxes 26 each of which accommodates a plurality of trays. Each of the tray accommodating boxes 26 is supported by a support member (not shown), and is moved upward by an elevating and lowering device (not shown) to an EC-supply position above which a predetermined head-movement space is provided for a mounting head 60, described later, to take out ECs from the trays of the each box 26 being positioned at the EC-supply position.

When each tray accommodating box 26 has finished supplying ECs, the each box 26 is moved upward from the EC-supply position by a distance corresponding to the head-movement space toward an upper waiting space, while the next box 26 is moved upward to the EC-supply position. The tray-type EC supplying device 22 is identical with the EC supplying apparatus disclosed in Japanese Patent Document No. 2(1990)-57719, except that in the supplying device 22, the EC-supply position is gradually lowered by a distance corresponding to each box 26 each time the each box 26 is moved upward from the EC-supply position and the next box 26 is moved upward to the EC-supply position. Therefore, no further description of the device 22 is provided. An operator can draw each tray accommodating box 26 in the X-axis direction, as indicated at two-dot chain line in FIG. 3, so that the operator can check the trays accommodated therein.

ECs 28 which are supplied by the feeder-type EC supplying device 20 and the tray-type EC supplying device 22 are mounted on the printed board 16 by an EC mounting device 30 which is provided on the bed 10. As shown in FIG. 2, two guide rails 32 which extend in the X-axis direction are provided, on the bed 10, on both sides of the board conveyor 18 in the Y-axis direction, and an X-axis slide 34 fits on the guide rails 32 via respective guide blocks 26 such that the X-axis slide 34 is movable in the X-axis direction.

Figure 4:
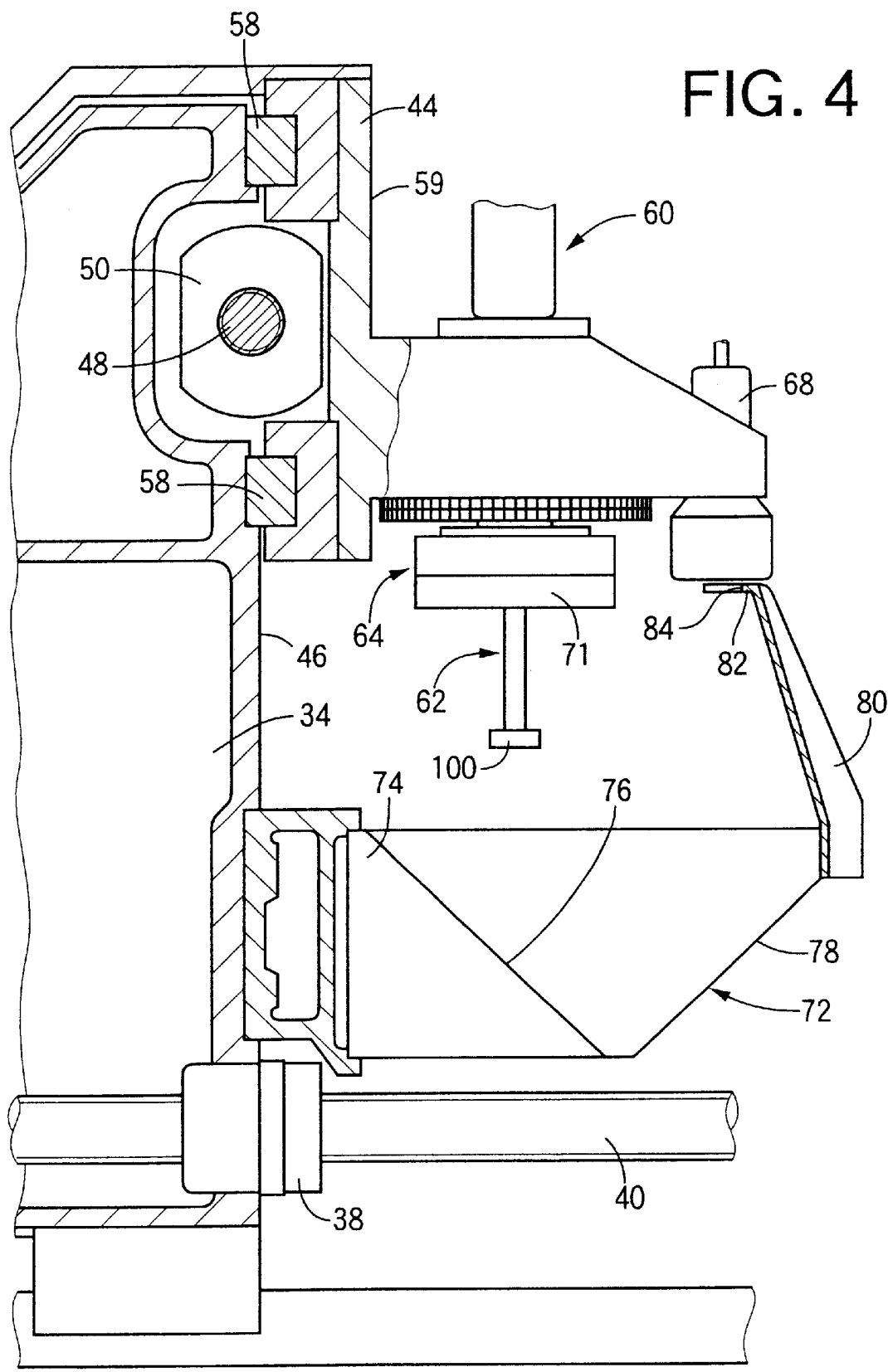
FIG. 4 is a cross-sectioned, side elevation view of a mounting head of the system of FIG. 1.

As shown in FIG. 3, the X-axis slide 34 extends from the feeder-type EC supplying device 20 to the tray-type device 22 over the board conveyor 18, and two nuts 38 (only one nut 28 is shown in FIG. 4) are fixed to the X-axis slide 34. The two nuts 38 are threadedly engaged with two ball screws 40, respectively. When the two ball screws 40 are rotated in synchronism with each other by two X-axis servomotors 42, respectively, the X-axis slide 34 is moved in the X-axis direction.

As shown in FIGS. 3 and 4, on the X-axis slide 34, a Y-axis slide 44 is provided such that the Y-axis slide 44 is movable in the Y-axis direction perpendicular to the X-axis direction on the horizontal plane. As shown in FIG. 4, the X-axis slide 34 has a vertical surface 46 to which a ball screw 48 which extends in the Y-axis direction is fixed, and a nut 50 fixed to the Y-axis slide 44 is threadedly engaged with the ball screw 48. When the ball screw 48 is rotated by a Y-axis servomotor 52, shown in FIG. 3, via gears 54, 56, the Y-axis slide 44 is moved in the Y-axis direction by being guided by a pair of guide rails 58.

As shown in FIG. 4, the Y-axis slide 44 has a vertical surface 59 which supports a mounting head 60 which includes a suction nozzle 62 as a component holder that sucks and holds an EC 28, and a nozzle holder 64 which is movable up and down relative to a main frame of the head 60. The mounting head 60 additionally includes a fiducial-mark (F-mark) camera 66 which takes respective images of fiducial marks (F-marks) as reference marks that are provided on the printed board 16; and an EC camera 68 which takes an image of an EC 68 which is held by the suction nozzle 62. The main frame of the mounting head 60 supports the suction nozzle 62, the F-mark camera 66, and the EC camera 68 such that those three elements 62, 66, 68 are not movable relative to one another. Each of the two cameras 66, 68 is a CCD (charge-coupled device) camera.

A lighting device 70 is provided for the F-mark camera 66, and lights the F marks and their adjacent portions of the printed board 16. The F-mark camera 66 takes respective images of the F marks through an opening which is formed in a central portion of the lighting device 70. The nozzle holder 64 includes a back light 71 which lights a back surface of the EC 28 held by the suction nozzle 62, and the EC camera 68 takes a silhouette image of the EC 62 in the light background created by the back light 71.

As shown in FIG. 4, the EC camera 68 is fixed to a projecting end portion of the Y-axis slide 44 that projects in the X-axis direction, such that the camera 68 is aligned with the suction nozzle 62 in the Y-axis direction and is oriented downward.

As shown in FIGS. 3 and 4, two prisms 72 each as a reflecting device are fixed to the X-axis slide 34 (only one prism 72 is shown in FIG. 4). The two prisms 72 cooperate with the EC camera 68 to provide an image taking system. The two prisms 72 are supported by a lower portion of the X-axis slide 34, at two positions which correspond, in the Y-axis direction, at the two ball screws 40 for moving the X-axis slide 34, one of which is located between the feeder-type EC supplying device 22 and the board positioning and supporting device or the printed board 16, and the other of which is located between the tray-type EC supplying device 22 and the printed board 16.

The two prisms 72 have a same construction. Each prism 72 includes a casing 74 which is fixed to the X-axis slide 34, as shown in FIG. 4, and has a first reflecting surface 76 which is inclined, right below a path of movement of the mounting head 60 in the Y-axis direction, by about 45 degrees relative to a vertical plane including the centerline (i.e., axis line) of the suction nozzle 62, and whose lower end is more distant from the X-axis slide 34 than an upper end thereof. The prism 72 additionally has a second reflecting surface 78 which is provided right below a path of movement of the EC camera 68 in the Y-axis direction, such that the second reflecting surface 78 is symmetrical with the first reflecting surface 76 with respect to the vertical plane.

A shutter 80 is fixed to an outer side surface of the casing 74 that is opposite to the X-axis slide 34. A dimension of the shutter 80 in the Y-axis direction is equal to those of the two reflecting surfaces 76, 78. An upper portion of the shutter 80 projects upward from the casing 74, and an end portion of the upper portion is bent toward the X-axis slide 34 in a horizontal direction so as to provide a shield portion 82 which projects into a space between the second reflecting surface 78 and the EC camera 68. The shield portion 82 has a cutout 84 in a middle portion thereof in the Y axis direction. Therefore, when the Y-axis slide 44 is moved in the Y-axis direction, the EC camera 68 is moved above the shield portion 82 and, when passing over the cutout 84, receives the light reflected by the second reflecting surface 78. A dimension of the cutout 84 in the Y-axis direction is so determined as to be equal to a length, vt, obtained as the product of a speed, v, of movement of the EC camera 68 in the Y-axis direction and a time, t, of exposure of the same 68.

As shown in FIGS. 1 and 3, the board conveyor 18 has four chip-place positions 102 on respective upper surfaces of two guide rails 104 of the conveyor 18. A standard chip 100 (FIG. 4) having the standard dimensions of each EC 28 is placed at an appropriate one of the four chip-place positions 102 to measure a mounting accuracy of the present EC mounting system in a manner described later. In the present embodiment, four standard chips 100 are placed and kept at the four chip-place positions, respectively, though not shown in FIG. 1 or FIG. 3. The two guide rails 104 guide two conveyor belts (not shown). The distance between the two guide rails 104 in the Y-axis direction can be changed to be able to convey printed boards 16 of different sizes. One 104 of the two guide rails 104 is movable relative to the other, stationary guide rail 104 in the Y-axis direction to change the distance between the two rails 104. Each of the two guide rails 104 has, on the upper surface thereof, the corresponding two chip-place positions 102 which are adjacent to the printed board 16 being positioned at the prescribed position by the board positioning and supporting device.

However, the total number of the chip-place positions 102 may not be four, but may be one or an appropriate number greater than one. The total number of standard chip or chips 100 that is or are placed at each one chip-place position 102 may be either one or a number greater than one. Moreover, the standard chips 100 may be exclusively placed at the corresponding chip-place positions 102 only, respectively, or each of the chips 100 may be arbitrarily placed at any one of the four positions 102. In the present embodiment, it is assumed that the four standard chips 100 are exclusively placed and kept at the corresponding chip-place positions 102, respectively.

Each of the standard chips 100 is formed of a plastic material, and has a rectangular plan-view shape having dimensions of 3 mm×6 mm. However, one or more proper ECs 28 which should be placed on the printed board 16 may be used as one or more standard chips 100. Alternatively, each standard chip 100 may be formed of a crystal glass with a high dimensional accuracy.

Figure 5:
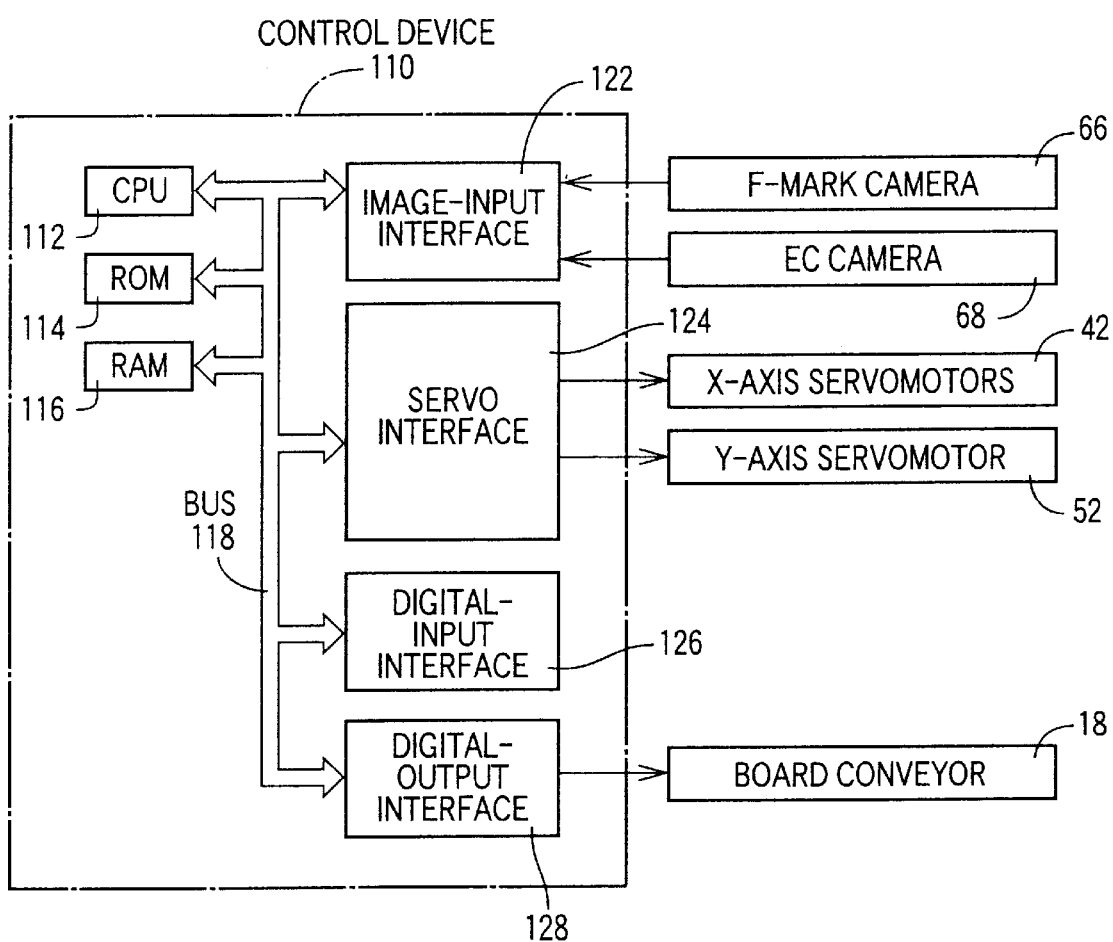
FIG. 5 is a diagrammatic view of a control device of the system of FIG. 1.

The present EC mounting system includes a control device 110 shown in FIG. 5. The control device 110 is essentially provided by a computer including a central processing unit (CPU) 112, a read only memory (ROM) 114, a random access memory (RAM) 116, and a bus 118 which couples those elements 112, 114, 116 to one another. An image-input interface 122 is coupled to the bus 118, and the F-mark and EC cameras 66, 68 are connected to the image-input interface 122. A servo interface 124 is also coupled to the bus 118, and the X-axis servomotors 42 and the Y-axis servomotor 52 are connected to the servo interface 124. In addition, a digital-input interface 126 is coupled to the bus 118, and the operation panel (not shown) is connected to the digital-input interface 126. Moreover, a digital-output interface 128 is coupled to the bus 118, and the board conveyor 18, the feeder-type and tray-type EC supplying devices 20, 22, and the EC mounting device 30 are connected to the digital-output interface 128. The ROM 114 stores various control programs including a mounting program which is used by the computer to mount the ECs 28 on the printed board 16, and a mounting-accuracy measuring program which is represented by the flow charts shown in FIGS. 8 to 11.

Next, the operations of the EC mounting system constructed as described above will be described. Since the EC mounting operation of the present system is described in detail in the above-indicated Japanese Patent No. 2,824,378, the EC mounting operation is just briefly described and a mounting-accuracy measuring operation of the present system is described in detail.

In the EC mounting operation, first, the X-axis slide 34 and/or the Y-axis slide 44 is/are moved to move the mounting head 60 to the EC-supply position of the feeder-type or tray-type EC supplying device 20, 22 where the mounting head 60 or the suction nozzle 62 holds one EC 28 supplied by the supplying device 20, 22. After the suction nozzle 62 contacts the EC 28, a negative air pressure is supplied to the nozzle 62 so that the nozzle 62 sucks and holds the EC 28, and subsequently the nozzle 62 is moved upward.

The mounting head 60 (i.e., the suction nozzle 62) holding the EC 28 is moved, along a straight line connecting between the EC-supply position of the EC supplying device 20, 22 and a prescribed EC-mount place on the printed board 16, toward the EC-mount place. During this movement, the head 60 passes over one prism 72 which is fixed to the X-axis slide 34 at the position between the EC-supply position and the EC-mount place. Wherever the EC-supply position may be on the feeder-type or tray-type EC supplying device 20, 22, or wherever the EC-mount place may be on the printed board 16, the mounting head 60 needs to move in the Y-axis direction on the X-axis slide 34 and pass over a portion of the slide 34 located between the supplying device 20, 22 and the printed board 16, for the purpose of moving from the EC-supply position to the EC-mount place. Therefore, the head 60 must pass over one prism 72 fixed to that portion of the slide 34 located between the supplying device 20, 22 and the printed board 16.

During this movement, the light which forms the silhouette image of the EC 28 in the light background created by the back light 71, is reflected in a horizontal direction by the first reflecting surface 76 and then is reflected upward by the second reflecting surface 78. When the mounting head 60 or the suction nozzle 62 passes over the prism 72, the EC 28 held by the nozzle 62 passes over the first reflecting surface 76 and concurrently the EC camera 68 passes over the second reflecting surface 78, so that the image forming light passes through the recess 84 of the shield portion 82 of the shutter 80 and is incident to an image-take surface (i.e., a CCD matrix) of the EC camera 68. Thus, the EC camera 68 takes the silhouette image of the EC 28 held by the nozzle 62.

Since both the EC camera 68 and the suction nozzle 62 are supported by the Y-axis slide 44, the camera 68 and the EC 28 held by the nozzle 62 are moved as a unit in the Y-axis direction. Therefore, when the EC 28 passes over the prism 72, the image forming light reflected by the first and second reflecting surfaces 76, 78 follows the EC camera 68. Thus, though the Y-axis slide 44 is being moved, the EC camera 68 can take the image of the EC 28 as if the EC 28 were kept still. As described above, the dimension of the cutout 84 in the Y-axis direction is equal to the length obtained as the product of the speed of movement of the EC camera 68 in the Y-axis direction and the time of exposure of the same 68.

Thus, each of the CCDs defining the image-take surface of the EC camera 68 is exposed for a sufficient time to the image forming light, and accordingly a clear silhouette image of the EC 28 is taken by the camera 68.

The control device 110 compares image data representing the thus taken, actual image of the EC 28, with reference image data representing a reference image of EC 28 that is free of center-position errors, $\Delta X$, $\Delta Y$, and an angular error, $\Delta \Theta$. The actual image of the EC 28 held by the suction nozzle 62 may possibly include respective errors $\Delta X$, $\Delta Y$ of the actual center position thereof from respective reference center positions in the X-axis and Y-axis directions, and/or an angular error $\Delta \Theta$ of the actual angular phase (i.e., the rotation position) thereof from a reference angle about an axis line thereof parallel to the axis line of the suction nozzle 62. Based on this comparison, the control device 110 calculates the center-position errors $\Delta X$, $\Delta Y$ and angular error $\Delta \Theta$ of the EC 28 held by the suction nozzle 62. In addition, the control device 110 calculates, in advance, the X-axis-direction and Y-axis direction errors $\Delta X'$, $\Delta Y'$ and angular error $\Delta \Theta'$ of the printed board 16 being positioned and supported by the positioning and supporting device (not shown), based on the respective images of the F marks thereof taken by the F-mark camera 66. During the movement of the mounting head 60 from the EC-supply position toward the EC-mount place, respective amounts of movement of the mounting head 60 (or the suction nozzle 62) in the X-axis and Y-axis directions are corrected based on the thus calculated errors $\Delta X$, $\Delta Y$, $\Delta X'$, $\Delta Y'$, and concurrently the nozzle holder 64 holding the suction nozzle 62 is rotated to correct the angular errors $\Delta \Theta$, $\Delta \Theta'$. Thus, the EC 28 is mounted, with the accurate angular phase or rotation position, at the accurate EC-mount place on the printed board 16.

After the mounting head 60 is positioned at a position above the accurate EC-mount place on the printed board 16, the suction nozzle 62 is lowered to mount the EC 28 at the accurate EC-mount place on the printed board 16. In this way, one EC 28 is mounted on the board 16. This operation is repeated to mount a plurality of ECs 28 on the board 16.

The present EC mounting system measures, while it is performing the EC mounting operation, its mounting accuracy, i.e., carries out the mounting-accuracy measuring program represented by the flow charts shown in FIGS. 8 to 11. While the EC mounting system is operated, this program is continuously carried out to monitor the current step of the EC mounting operation. Therefore, the mounting system can take such a chance which enables itself to measure its mounting accuracy without delaying any steps of the EC mounting operation. More specifically described, when the mounting system has finished mounting all the ECs 28 on one printed board 16 and starts carrying out the one board 16 by operating the board conveyor 18, the mounting system starts a mounting-accuracy measuring operation; and before the mounting system finishes carrying in, and positioning, the next printed board 16, the mounting system finishes the mounting-accuracy measuring operation.

The mounting-accuracy measuring operation is carried out as follows: First, the mounting head 60 or the suction nozzle 62 is moved to a position corresponding to one (e.g., the most nearest thereto) of the four chip-place positions 102. As the suction nozzle 62 sucks and holds each EC 28 from the EC supplying device 22, 24, the nozzle 62 sucks and holds the standard chip 100 which is placed in advance at the one chip-place position 102. The nozzle 62 holding the standard chip 100 is moved to a first image-take position, that is, a position corresponding to one of the two prisms 72 that is the nearer to the one chip-place position 102. The nozzle 62 is reciprocated two times, each over the one prism 72, such that at each of two positions offset in opposite directions from the first image-take position, the nozzle 62 is rotated by 90 degrees, i.e., an incremental angle. Thus, the EC camera 68 takes an image of the standard chip 100 being positioned at each of the four rotation positions, i.e., 0 degree, 90 degrees, 180 degrees, and 270 degrees.

Figure 6:
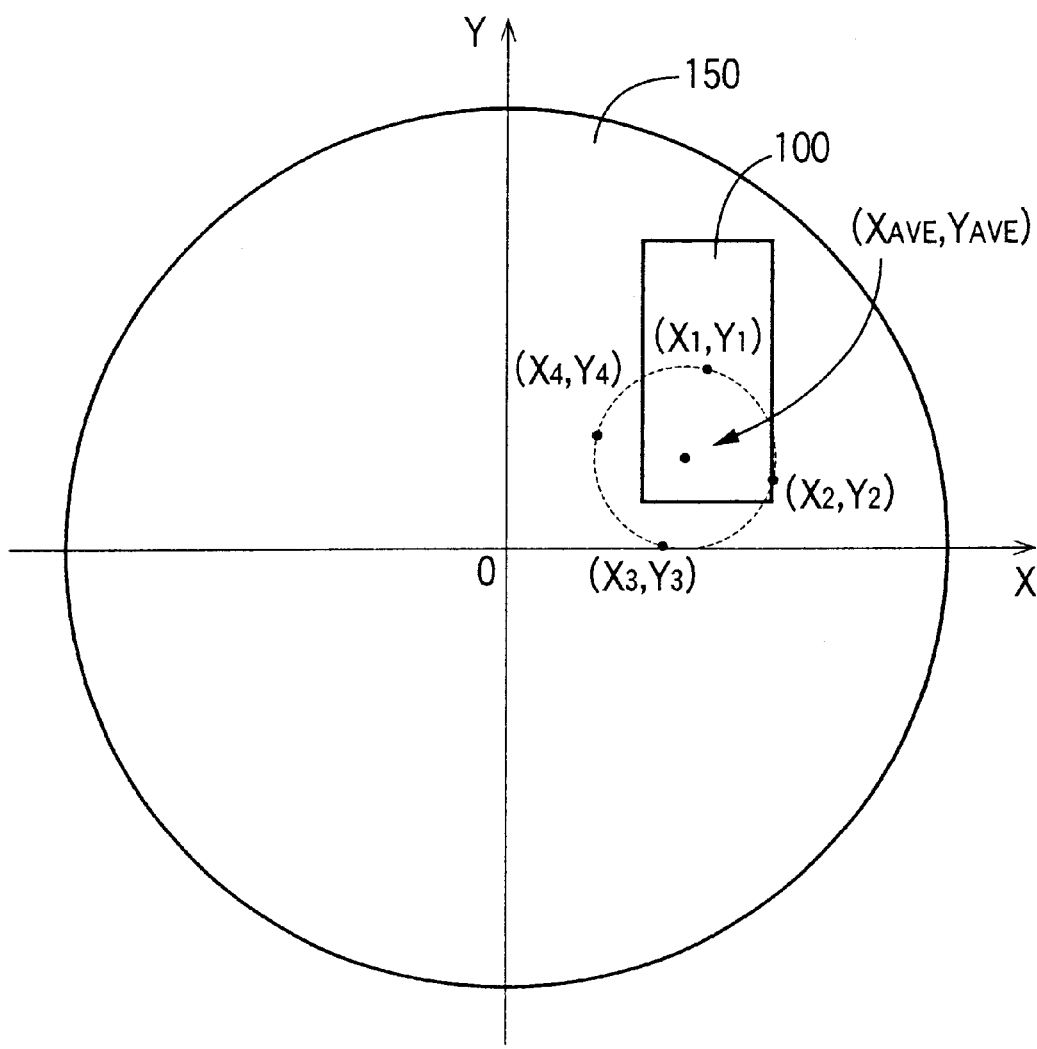
FIG. 6 is a view of an image taken by an EC camera of the system of FIG. 1.

Based on four batches of image data representing the four images of the standard chip 100 taken by the EC camera 68, the control device 110 calculates the X and Y coordinates of the center position of the standard chip 100 present in each of the four images. When the suction nozzle 62 is rotated about its axis line, i.e., its rotation-center position, the standard chip 100 is also rotated about the rotation-center position. As shown in FIG. 6, the EC camera 68 has an X-Y coordinate system or plane which is prescribed for a field of view 150 thereof. The origin, O, of the X-Y coordinate plane corresponds to the center position of the field of view 150 of the EC camera 68; and a straight line which perpendicularly intersects the plane and passes through the origin O corresponds to an optical axis of the camera 68. On the X-Y coordinate plane, the control device 110 determines the X and Y coordinates of the center position of the standard chip 100 present in each of the four images corresponding to the four rotation positions of the nozzle 62. In FIG. 6, only one image of the chip 100 is shown. Here, the X and Y coordinates of the center position of the standard chip 100 present in the n-th image (n is a natural number from one to four) of the four images is expressed as $(X_n, Y_n)$. The control device 110 calculates an average, $(X_{ave}, Y_{ave})$, of the four sets of X and Y coordinates determined respectively for the four images of the standard chip 100, as follows:

$$X_{ave}=(X_1+X_2+X_3+X_4)/4 \quad (1)$$

$$Y_{ave}=(Y_1+Y_2+Y_3+Y_4)/4 \quad (2)$$

This average center position $(X_{ave}, Y_{ave})$ is stored as the current temporary rotation-center position of the suction nozzle 62, in the RAM 116, and is used to correct the last proper rotation-center position, $(X_{center}, Y_{center})$, of the nozzle 62 that had been determined in the last mounting-accuracy measuring operation and has been stored in the RAM 116, and thereby determine a new proper rotation-center position $(X_{center}, Y_{center})$ of the nozzle 62. The manner of correction of the proper rotation-center position $(X_{center}, Y_{center})$ of the suction nozzle 62 will be described in detail, later.

The control device 110 determines the current temporary average center position $(X_{ave}, Y_{ave})$ and updates the proper rotation-center position $(X_{center}, Y_{center})$, while the mounting head 60 or the suction nozzle 62 is being moved back toward the one chip-place position 102. Additionally, the suction nozzle 62 is further rotated by 90 degrees and thereby back to its initial angular phase or rotation position, and then the center position and angular phase of the standard chip 100 held by the nozzle 62 are corrected based on the new or updated proper rotation-center position $(X_{center}, Y_{center})$ and the batch of image data representing the first (n=1) image of the chip 100. In other words, prescribed or reference control data which are used to move the suction nozzle 62 from the prescribed first image-take position to the one prescribed chip-place position 102 are modified based on the above-indicated data, so that the nozzle 62 is moved, according to the modified control data, to the one chip-place position 102. Then, the suction nozzle 62 places the standard chip 100 at the one chip-place position 102.

In this way, in the present embodiment, the standard chip 100 is returned to its corresponding chip-place position 102. However, in the case where one standard chip 100 is commonly used with two or more chip-place positions 102, it is possible to modify the control program to return the chip 100 to a chip-place position 102 different from the one chip-place position 102 from which the chip 100 had been taken by the nozzle 62. In the latter case, however, the control device 110 stores, in the RAM 116, data identifying one or more chip-place positions 102 each of which currently holds one standard chip 100.

Figure 7:
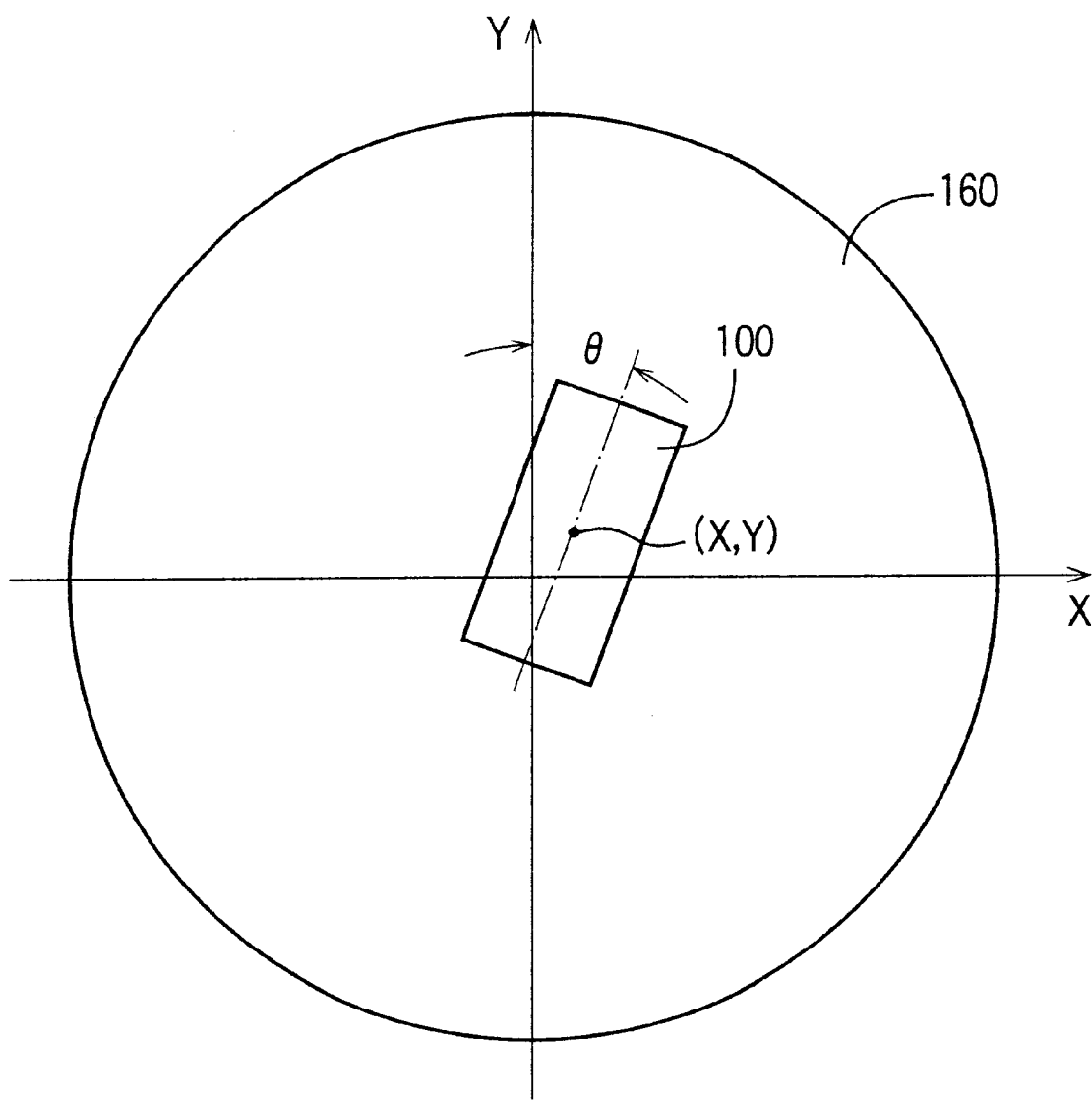
FIG. 7 is a view of an image taken by a fiducial-mark (F-mark) camera of the system of FIG. 1; of a mounting-accuracy measuring program according to which the control device controls the system of FIG. 1.
Figure 8:
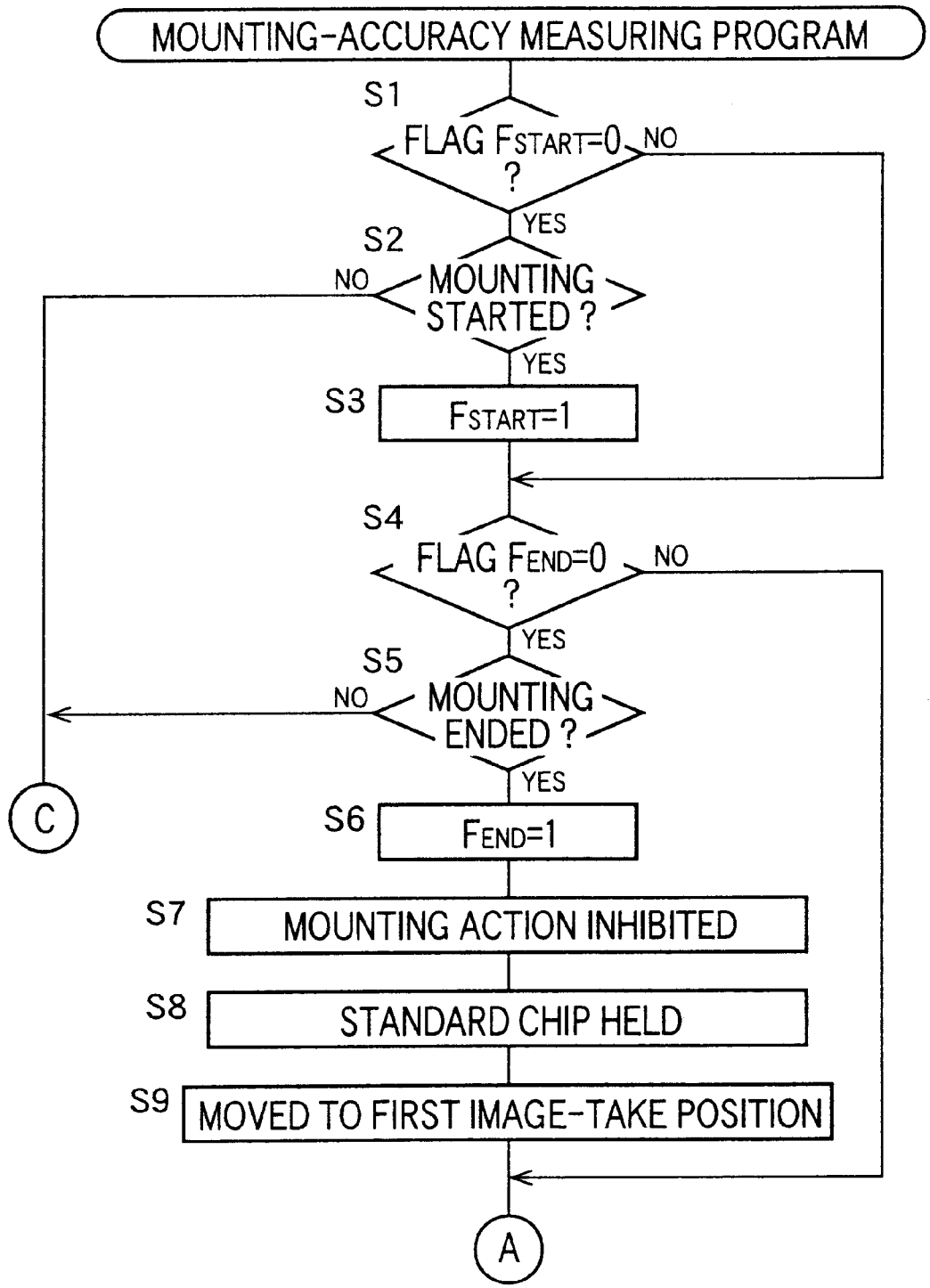
FIG. 8 is a flow chart representing a first portion of a mounting-accuracy measuring program according to which the control device controls the system of FIG. 1.

Next, the F-mark camera 66 takes an image of the standard chip 100 which is placed at the one chip-place position 102. The mounting head 60 or the suction nozzle 62 is moved from the position where the nozzle 62 had mounted the chip 100 at the one position 102, to a position where the F-mark camera 66 is positioned right above the one position 102, so that the camera 66 takes an image of the chip 100 placed at the one position 102. Here, it is noted that the nominal relative position, and nominal relative angular phase, between the rotation-center position (i.e., the rotation axis) of the nozzle 62 and the optical axis of the camera 66 are known and are included in the control program. If the actual relative position and angular phase have no errors, the center position of the standard chip 100 should coincide with a center position of a field of view 160 of the F-mark camera 66, i.e., an origin O, of an X-Y coordinate plane prescribed for the field of view 160, and the chip 100 should have no angular-phase error relative to the X and Y axes of the coordinate plane. FIG. 7 shows that the center position (X, Y) of the standard chip 100 present in the image taken by the camera 66 is deviated from the origin O of the X-Y coordinate plane. This means that there is a positional error between the rotation-center position of the suction nozzle 62 and the center position of the field of view 160 (i.e., the optical axis) of the camera 66. Hereinafter, this positional error will be referred to as the relative-position error between the suction nozzle 62 and the F-mark camera 66.

In addition, FIG. 7 shows that a lengthwise axis of the standard chip 100 has an inclination angle, Θ, with respect to a reference direction parallel to the Y axis. This means that there is an angular error between the angular phase of the field of view 160 of the F-mark camera 66 and the angular phase of the field of view 150 of the EC camera 68. Hereinafter, this angular error will be referred to as the angular-phase error between the F-mark camera 66 and the EC camera 68.

As described above, in the present embodiment, the standard chip 100 is returned to, and placed at, the one chip-place position, after the center position and angular phase of the standard chip 100 held by the nozzle 62 are corrected based on the updated proper rotation-center position $(X_{center}, Y_{center})$ and the batch of image data representing the first (n=1) image of the chip 100. However, this is not essentially required. That is, the chip 100 may be placed at the one position 102 without correcting the center position and angular phase thereof. In the latter case, the total amount of calculations that need to be carried out by the control device 110 to determine the mounting accuracy will be reduced as such. Moreover, the relative-position errors among the suction nozzle 62, the F-mark camera 66, and the EC camera 68, and the angular-phase error between the F-mark camera 66 and the EC camera 68 will be determined without being influenced by a possible angular error of the suction nozzle 62 that might be caused by the rotation of the nozzle 62 needed to correct the angular phase of the chip 100 or by a possible positional error of the center position of the chip 100 that might be caused by the rotation of the nozzle 62 needed to correct the angular phase of the chip 100 and/or by the X-axis-direction and/or Y-axis-direction movements of the nozzle 62 needed to correct the center position of the chip 100. In other words, in the case where the EC mounting system measures its mounting accuracy including the above-indicated possible angular and positional errors of the suction nozzle 62, the standard chip 100 is returned to the one chip-place position 102 after the center position and angular phase of the nozzle 62 have been corrected. It is possible to measure both a first mounting accuracy in the case where the center position and angular phase of the suction nozzle 62 are corrected, and a second mounting accuracy in the case where neither the center position nor the angular phase of the suction nozzle 62 is corrected, and determine, by comparing the first and second mounting accuracies with each other (e.g., determining a difference thereof), a third mounting accuracy relating to the portions (e.g., the suction nozzle 62 and the EC camera 68) of the mounting system that are used to correct the center position and angular phase of the nozzle 62 before the standard chip 100 is returned to the one chip-place position 102.

Thus, a temporary first relative position of the suction nozzle 62 relative to the EC camera 68, a temporary second relative position of the nozzle 62 relative to the F-mark camera 66, and a temporary relative inclination angle between the EC camera 66 and the F-mark camera 66 are determined, and the thus determined three temporary values are used to correct a proper first relative position, a proper second relative position, and a proper inclination angle which had been determined in the last mounting-accuracy measuring operation and have been stored in the RAM 116. The manner of correction of those proper characteristic values of the EC mounting system will be described in detail, later. Thus, the EC mounting system finishes one-time mounting-accuracy measuring operation and resumes the EC mounting-operation.

The mounting-accuracy measuring operation which has been briefly described above will be described in more detail by reference to the flow charts shown in FIGS. 8 to 11.

First, at Steps S1 to S3, the control device 110 waits for starting of a mounting action using the mounting head 60 for mounting one or more ECs 28 on one printed board 16. More specifically described, at Step S1, the control device 110 judges whether a mounting-starting flag, $F_{start}$, is set at 0 (i.e., $F_{start}=0$) indicating that the control device 110 has not recognized the starting of a mounting action. The alternative state of the flag $F_{start}$, i.e., $F_{start}=1$, indicates that the control device 110 has recognized the starting of mounting action. The current control cycle according to this control program is an initial one and accordingly the flag $F_{start}$ remains at its initial value, $F_{start}=0$. Therefore, a positive judgment is made at Step S1, and the control device 110 proceeds with Step S2 to judge whether a mounting action using the mounting head 60 has been started. If it is assumed that the current mounting action has not been started yet, a negative judgment is made at Step S2, and the current control cycle is terminated. On the other hand, if a positive judgment is made at Step S2, the control goes to Step S3 to set the mounting-starting flag $F_{start}$ to 1 ($F_{start}=1$). In each of the following control cycles according to this control program, a positive judgment is made at Step S1, and the control skips Steps S2 and S3, and jumps to Step S4.

Once the starting of a mounting action is recognized, the control device 110 repetitively carries out Steps S4 to S6 while waiting for ending of the current mounting action. More specifically described, like Steps S1 and S2, the control device 110 carries out Steps S4 and S5, i.e., judges at Step S4 whether a mounting-ending flag, $F_{end}$, is set at 0 (i.e., $F_{end}=0$) indicating that the control device 110 has not recognized the ending of the current mounting action, and judges at Step S5 whether the control device 110 has recognized the ending of the current mounting action. If a positive judgment is made at each of Steps S4 and S5, the control goes to Step S6 to set the mounting-ending flag $F_{end}$ to 1 ($F_{end}=1$). In each of the following control cycles according to this control program, a positive judgment is made at Step S4, and the control skips Steps S5 to S9, and jumps to Step S10.

Step S6 is followed by Step S7 to inhibit the starting of another mounting action using the mounting head 60. However, the carrying in and carrying out of printed boards 16 are allowed since it does not need the use of the mounting head 60. The mounting-accuracy measuring operation which is carried out according to this control program can be finished in a time which is needed for the carrying in and carrying out of printed boards 16. Therefore, the next mounting action is not started before the mounting-accuracy measuring operation is finished. However, if a command is issued to start the next mounting action before the finishing of the accuracy measuring operation, then there would be two commands which are not compatible with each other regarding the operation of the mounting head 60. This might lead to damaging the suction nozzle 62. Thus, the starting of the next mounting action is inhibited to take the precaution.

Step S7 is followed by Step S8 to move the mounting head 60 and operate the suction nozzle 62 to suck and hold the standard chip 100 at an appropriate one of the four chip-place positions 102. Then, at Step S9, the control device 110 moves the head 60 or the nozzle 62 to one of the two first image-take positions that corresponds to one of the two prisms 72 that is the nearer to the one chip-place position, so that the EC camera 68 may take images of the standard chip 100 held by the nozzle 62 at the one first image-take position.

Then, the control device 110 operates for reciprocating the mounting head 60, two times, each over the one prism 72, while rotating the suction nozzle 62 by 90 degrees at each of two positions deviated in opposite directions from the recess 84 of the shutter 80, so that the EC camera 68 takes an image of the chip 100 at each of the four rotation positions of the nozzle 62, i.e., 0 degree, 90 degrees, 180 degrees, and 270 degrees.

At Step S10, the control device 110 judges whether a first image-take flag, $F_1$, is set at 0 ($F_1=0$) indicating that the EC camera 68 has not taken the first one (n=1) of the four images (n=1 to 4) of the standard chip 100 at the four rotation positions. The flag $F_1$ set at 1 ($F_1=1$) indicates that the EC camera 68 has taken the first image of the chip 100. Since the current control cycle is an initial one and the flag $F_1$ remains at its initial value, $F_1=0$, a positive judgment is made at Step S10, and the control goes to Step S11 to judge whether the current image-take number n is not greater than 4. If it is assumed that the image-take number n is equal to 1, a positive judgment is made at Step S11, and the control device 110 goes to Steps S12 to S16, i.e., a first image-take step. At Step S12, the control device 110 operates for moving the mounting head 60 over the first image-take position, so that the EC camera 68 takes the n-th image of the chip 100. In the current control cycle, the camera 68 takes the first image of the chip 100 at the rotation position, 0 degree. Step S12 is followed by Step S13 to stop the mounting head 60 at a first stop position distant by a distance, s, from the first image-image position in a positive direction of the Y-axis direction. When the image-take number n is an odd number (n=1 or 3), the head 60 is moved in the positive direction; and when the image-take number n is an even number (n=2 or 4), the head 60 is moved, in a negative direction of the Y-axis direction, to a second stop position distant by the same distance s from the first image-take position. Then, at Step S14, the control device 110 operates for rotating the suction nozzle 62 by 90 degrees.

Step S14 is followed by Step S15 to process an n-th batch of image data representing the taken n-th image of the standard chip 100 and determine X and Y coordinates, ($X_n$, $Y_n$), of the center position of the chip 100 present in the taken n-th image. At Step S16, the control device 110 adds one to the image-take number n to provide the new image-take number n. Thus, one control cycle according to this control program is ended. After Steps S12 to S16 are repeated four times and the four images of the standard chip 100 are taken, a negative judgment is made at Step S11 in the next control cycle, and the control goes to Step S17 to set the first image-take flag $F_1$ to 1 ($F_1$=1). Thus, the control cycle is ended. In each of the following control cycles till the end of the current accuracy measuring operation, the control device 110 skips Steps S11 to S17.

In the above description, Step S15 time-wise follows Step S14. In fact, however, Steps S14 and S15 are concurrently carried out. It goes without saying that Steps S14 and S15 may be carried out in the order of illustration in FIG. 9.

In the next control cycle according to this control program, the control device 110 reads out, at Step S18, the four sets of center-position coordinates ($X_n$, $Y_n$) of the standard chip 100, determined at Step S12 to S16, from the RAM 116. S18 is followed by Step S19 to calculate an average ($X_{ave}$, $Y_{ave}$) of the four sets of center-position coordinates ($X_n$, $Y_n$) according to the previously described expressions (1), (2). Then, at Step S20, the control device 110 reads out, from the RAM 116, a proper set of center-position coordinates ($X_{center}$, $Y_{center}$) as one of proper characteristic values of the EC mounting system. The proper set of center-position coordinates ($X_{center}$, $Y_{center}$) is the last one which had been determined in the last mounting-accuracy measuring operation and has been stored in the RAM 116. Each of the characteristic values is characteristic of the individual EC mounting system. However, if the current mounting-accuracy measuring operation is the first one after the current operation of the EC mounting system is started upon application thereto of electric power, the proper set of center-position coordinates ($X_{center}$, $Y_{center}$) is a predetermined set of center-position coordinates which are pre-stored in the ROM 112 of the EC mounting system.

At Step S21, the control device 110 corrects the last proper set of center-position coordinates ($X_{center}$, $Y_{center}$) determined in the last mounting-accuracy measuring operation, based on the current temporary set of center-position coordinates, i.e., the average set of center-position coordinates ($X_{ave}$, $Y_{ave}$) of the standard chip 100, determined at Step S19, and a correction index, N−1. More specifically described, the last proper set of center-position coordinates ($X_{center}$, $Y_{center}$) is updated according to the following expressions (3) and (4):

$$X_{center} = (X_{ave} - X_{center})/2^{(N-1)} + X_{center} \quad (3)$$

$$Y_{center} = (Y_{ave} - Y_{center})/2^{(N-1)} + Y_{center} \quad (4)$$

The number N is set to 1 (N=1) when the current operation of the EC mounting system is started and, while the current operation of the mounting system is continued, the number N is incremented by one each time one mounting-accuracy measuring operation is carried out, but does not exceed 6. After the number N increases up to 6, the number N is kept at 6 even if the current operation of the mounting system is further continued.

Then, at Steps S22 and S23, the control device 110 operates for rotating the suction nozzle 62 and moving the nozzle 62 back to the one chip-place position 102. More specifically described, at Step S22, the nozzle 62 is so rotated that the standard chip 100 held thereby may have no inclination angle Θ with respect to the one chip-place position 102, and at Step S23 the nozzle 62 is so moved that the center position of the chip 100 may coincide with the center position of the same 102. Though Step S23 follows Step S22 in the flow chart of FIG. 10, Steps S22 and S23 are carried out, in fact, concurrently with the terminal period of Steps S14 and S15 (i.e., the processing of the fourth image of the chip 100 and the rotation of the nozzle 62 from 270 degrees to 360 degrees (i.e., 0 degree)) and with the processing of data at Steps S18 to S21. It goes without saying that Steps S22 and S23 may be carried out in the order of illustration in FIG. 10.

Next, at Step S24, the control device 110 operates for placing the standard chip 100 at the one chip-place position. Step S24 is followed by Step S25, i.e., a second image-take step in which the F-mark camera 66 takes an image of the standard chip 100 placed at the one chip-place position 102. At Step S26, the control device 110 determines, based on image data representing the image of the standard chip 100 taken at the second image-image step, a set of X and Y coordinates, and an inclination angle Θ, of the center position of the chip 100. The F-mark camera 66 has the X-Y coordinate plane prescribed for the field of view 160 thereof, and the origin O of the coordinate plane corresponds to the center position of the field of view 160. The optical axis of the camera 66 is defined as a straight line which perpendicularly intersects the coordinate plane and passes through the origin O of the same. Therefore, the control device 110 determines the X and Y coordinates (X, Y) of the center position of the chip 100 in the X-Y coordinate plane, and the inclination angle Θ of the lengthwise axis of the chip 100 relative to the Y axis of the coordinate plane about the optical axis (i.e., the origin O) of the camera 66.

Subsequently, at Step S27, the control device 110 adopts the X and Y coordinates (X, Y) and inclination angle Θ of the standard chip 100, determined at Step S26, as a temporary relative-position error between the rotation-center position of the suction nozzle 62 and the optical axis of the F-mark camera 66 and a temporary angular-phase error between the respective optical axes of the EC camera 68 and the F-mark camera 66. At Step S24, the center position of the standard chip 100 should have been coincided with the center position of the field of view 160 of the F-mark camera 66, and the lengthwise axis of the chip 100 should have been coincided with the Y axis of the X-Y coordinate plane prescribed for the field of view 160, based on the X and Y coordinates of the center position of the chip 100 determined at Steps S12 to S19 and the X and Y coordinates of the rotation-center position of the nozzle 62. Therefore, the X and Y coordinates (X, Y) of the current relative position of the rotation center of the suction nozzle 62 relative to the optical axis of the F-mark camera 66 is deviated by the same values X, Y from the last proper X and Y coordinates ($X_0$, $Y_0$) that had been determined in the last accuracy measuring operation, and the inclination angle Θ of the current angular phase of the optical axis of the F-mark camera 66 relative to that of the EC camera 68 is deviated by the same angle Θ from the last proper angular-phase error $Θ_0$ that had been determined in the last accuracy measuring operation.

Next, at Step S28, the control device 110 reads out, from the RAM 116, the last proper X and Y coordinates ($X_0$, $Y_0$) of the rotation-center position of the suction nozzle 62 relative to the F-mark camera 66 and the last proper angular-phase error $\Theta_0$ of the F-mark camera 66 relative to the EC camera 68. Step S28 is followed by Step S29 to determine a new proper set of X and Y coordinates ($X_0$, $Y_0$) and a new angular-phase error $\Theta_0$ according to the following expressions (5), (6), and (7):

$$X_0 = X/2^{(N-1)} + X_0 \quad (5)$$

$$Y_0 = Y/2^{(N-1)} + Y_0 \quad (6)$$

$$\Theta_0 = \Theta/2^{(N-1)} + \Theta_0 \quad (7)$$

At Step S30, the control device 110 judges whether the number N indicating the total number of accuracy measuring operations is smaller than 6. If it is assumed that in the current control cycle, the number N is equal to 1, a positive judgment is made at Step S30 and the control goes to Step S31 to add 1 to the number N to update the number N. On the other hand, if the number is equal to 6, a negative judgment is made at Step S30, and the control device 110 skips Step S32. In the present embodiment, immediately after the current operation of the EC mounting system has been started, the control device 110 weighs each current temporary characteristic value X, Y, $\Theta$ more than each last proper characteristic value $X_0$, $Y_0$, $\Theta_0$, and determines, as each new proper characteristic value $X_0$, $Y_0$, $\Theta_0$, a value which is between the each current temporary characteristic value X, Y, $\Theta$ and the each last proper characteristic value $X_0$, $Y_0$, $\Theta_0$ and is nearer to the each current temporary characteristic value X, Y, $\Theta$; and as the number N increases, the control device 110 weighs each last proper characteristic value $X_0$, $Y_0$, $\Theta_0$ more than each current temporary characteristic value X, Y, $\Theta$, and determines, as each new proper characteristic value $X_0$, $Y_0$, $\Theta_0$, a value which is between the each, current temporary characteristic value X, Y, $\Theta$ and the each last proper characteristic value $X_0$, $Y_0$, $\Theta_0$ and is nearer to the each last proper characteristic value $X_0$, $Y_0$, $\Theta_0$.

In the present embodiment, the upper limit of the number N is pre-selected at 6, because when the number N is greater than 6, a correction value for correcting each last proper characteristic value $X_0$, $Y_0$, $\Theta_0$ is too small to follow effectively even small changes of the each proper characteristic value $X_0$, $Y_0$, $\Theta_0$. The upper limit of the number N is so determined as to avoid this problem.

Next, at Step S32, the control device 110 resets the flags $F_{start}$, $F_{end}$, and $F_1$ to $F_{start}=0$, $F_{end}=0$, and $F_1=0$, and resents the number n to n=1. Step S32 is followed by Step S33 to remove the inhibition of mounting operation which has been made at Step S7, i.e., allow the starting of mounting operation. Thus, one-type control cycle according to the mounting-accuracy measuring program is terminated.

It emerges from the foregoing description that in the present embodiment, the F-mark camera 66 provides a second image-taking device; the EC camera 68 provides a first image-taking device. Steps S12 to S16 of the mounting-accuracy measuring program provide a first image-taking step; Steps S18 to S21 provides a first image-processing step; Steps S22 to S24 provides a standard-chip placing step; Step S25 provides a second image-taking step; and Steps S26 to S29 provide a second image-processing step.

In the present embodiment, the relative-position error of the suction nozzle 62 relative to the EC camera 68, the relative-position error of the suction nozzle 62 relative to the F-mark camera 66, and the angular-phase error of the EC camera 68 relative to the F-mark camera 66 are measured and corrected. Therefore, the EC mounting system can improve its mounting accuracy.

In a different method, a relative-position error and an angular-phase error of the F-mark camera 66 relative to a main member of the EC mounting device 30 may be measured. For example, the main member is provided with at least one stationary reference mark for measuring the relative-position error and angular-phase error of the F-mark camera 66, and the camera 66 is operated to take an image of the reference mark at an appropriate number of times. Based on the taken image or images, the control device 110 may determine relative-position error and angular-phase error of the F-mark camera 66.

More specifically described, for example, in the case where the F-mark camera 66 is provided on the main member such that the X and Y axes of the X-Y coordinate plane prescribed for the field of view 160 of the camera 66 are parallel to the X-axis and Y-axis directions indicated in FIG. 3, respectively, a first straight line passing through a row of reference marks present in the taken image should be parallel to the X axis and a second straight line passing through a column of reference marks present in the taken image should be parallel to the Y axis. Meanwhile, in the case where the F-mark camera 66 is provided on the main member such that the X and Y axes of the X-Y coordinate plane of the field of view 160 of the camera 66 are inclined relative to the X-axis and Y-axis directions, the first and second straight lines intersect the X and Y axes, respectively. In this case, an average of the respective inclination angles of the first and second straight lines relative to the X and Y axes is determined as an inclination angle of the F-mark camera 66 relative to the main member of the EC mounting device 30.

In the present embodiment, after the inclination angle of the standard chip 100 held by the suction nozzle 62 is corrected at Step S22, the chip 100 is placed at one of the chip-place positions 102. Therefore, in this, first manner, the inclination angle $\Theta$ determined at the second image-processing step contains both the angular-phase error between the F-mark camera 66 and the EC camera 68 and the angular error of the suction nozzle 62 caused by the rotation thereof at Step S22. On the other hand, in a second manner, if Step S22 is skipped so that the standard chip 100 is placed at the chip-place position 102 without any correction of the inclination angle thereof, the control device 110 measures only the angular-phase error between the F-mark camera 66 and the EC camera 68. Moreover, in a third manner, if the control device 110 alternately carries out the above-indicated first and second manners, in successive control cycles, the control device 110 can measure the angular-phase error between the F-mark camera 66 and the EC camera 68, and the angular error of the suction nozzle 62 caused by the rotation thereof at Step S22, separately from each other.

In the present embodiment, immediately after the commencement of the operation of the EC mounting system, the control device 110 weighs each current temporary characteristic value and determines, as each new proper characteristic value, a value which is intermediate between the each current temporary characteristic value and each last proper characteristic value and is nearer to the each current temporary characteristic value. Thus, the mounting system can effectively follow the change of each proper characteristic value that may be caused by, e.g., the change of temperature. In addition, as the total number of mounting-accuracy measuring operations increases, the control device 110 weighs each last proper characteristic value and determines, as each new proper characteristic value, a value which is intermediate between each current temporary characteristic value and each last proper characteristic value and is nearer to the each last proper characteristic value. Thus, as the change of each proper characteristic value decreases, the EC mounting system can effectively reduce the influence of measurement error that may be involved into the each current temporary characteristic value.

In contrast, in the case where the amount of change of each characteristic value of the EC mounting system during the operation thereof does not change so much as time elapses, and is greater than the measurement error, it is preferred that the control device 110 determine each new proper characteristic value while weighing each current temporary characteristic value more than each last proper characteristic value.

In the present embodiment, the EC mounting system measures its mounting accuracy each time one-time mounting action is completed on one printed board 16. However, the mounting system may be so modified as to measure its mounting accuracy each time the mounting system carries out a predetermined number (greater than 1) of mounting actions on a corresponding number of printed boards 16, respectively, or at a predetermined regular interval of time (more strictly, when prinnted boards 16 are carried out and carried in for the first time after the predetermined regular time interval has elapsed). In the last case, for example, the EC mounting system may be operated in such a manner that when the mounting system is started upon application thereto of electric power, the system carries out the first mounting-accuracy measuring operation and then periodically repeats its measuring operation when printed boards 16 are carried out and carried in for the first time after the predetermined regular time interval (e.g., 5 minutes) has elapsed.

In the illustrated embodiment, the index number, N−1, used for correcting each last proper characteristic value based on each current temporary characteristic value is obtained from the total number of mounting-accuracy measuring operations, i.e., the total number of proper-characteristic-value correcting operations. However, the index number may be a constant value. In the latter case, it is preferred that, the frequency at which the accuracy measuring operations are carried out, i.e., the proper-characteristic-value correcting operations are carried out be changed depending upon the total number of printed boards 16 on each of which the mounting of ECs 28 have been completed, or the time which has elapsed from the commencement of the current operation of the EC mounting system. For example, the mounting system may be operated in such a manner that in one hour after the commencement of the operation thereof during which each proper characteristic value thereof greatly changes, the system frequently corrects the each proper characteristic value and, in the subsequent period in which the each proper characteristic value does not change so greatly, the system corrects less frequently. Thus, excessive or unnecessary correcting operations can be avoided.

In the illustrated embodiment, in each mounting-accuracy measuring operation, the F-mark camera 66 takes an image of the standard chip 100 placed at one chip-place position 102, and the control device 110 determines the X and Y coordinates (X, Y) of the center position of the chip 100 relative to the center position (i.e., the origin O) of the field of view 160 of the camera 66, and the inclination angle θ of the lengthwise axis of the chip 100 relative to the Y axis of the X-Y coordinate plane prescribed for the field of view 160. However, in the EC mounting system, the suction nozzle 62, the F-mark camera 66, and the EC camera 68 are fixedly provided on the mounting head 60 such that the three elements 62, 66, 68 are immovable relative to one another. Thus, the relative position between each one of the three elements and each of the other two elements may be regarded as being substantially constant under special conditions. That is, the change of relative position between the suction nozzle 62 and the EC camera 68 and the change of relative angular phase between the F-mark camera 66 and the EC camera 68 can be neglected and accordingly the relative position between the suction nozzle 62 and the EC camera 68 and the relative angular phase between the F-mark camera 66 and the EC camera 68 can be regarded as being substantially constant. Therefore, the EC mounting system may be operated in such a manner than the mounting system measures the center-position coordinates (X, Y) and the inclination angle θ in only the first mounting-accuracy measuring operation following the commencement of the operation thereof and uses those values in each of subsequent accuracy measuring operations. Alternatively, the mounting system may be so modified as to measure the center-position coordinates (X, Y) and the inclination angle θ in every n-th (n is greater than 1) accuracy measuring operation, or at a frequency which changes as time elapses. Moreover, the mounting system may be so modified that after the amount of correction of the proper set of center-position coordinates (X, Y) and the amount of correction of the proper inclination angle θ gradually decrease down to below respective reference values, the system does not any longer measure the center-position coordinates (X, Y) or the inclination angle θ.

In the illustrated embodiment, the EC mounting system measures the X and Y coordinates ($X_{center}$, $Y_{center}$) of the rotation-center position of the suction nozzle 62, in each mounting-accuracy measuring operation. However, in the mounting system, the suction nozzle 62 and the EC camera 68 are fixedly provided on the mounting head 60 such that the nozzle 62 and the camera 68 are immovable relative to each other, and the images of the EC 28 held by the nozzle 62 are taken by the camera 68 while the prism 72 fixed to the X-axis slide 34 is utilized. Therefore, a positional error which may be caused by an positional error of the path of image-forming reflected light is negligibly small, and the relative position of the suction nozzle 62 relative to the EC camera 68 may be regarded as being substantially constant. Thus, the mounting system may be so operated as to measure, by rotating the nozzle 62, the X and Y coordinates ($X_{center}$, $Y_{center}$) of the rotation-center position of the nozzle 62, in the first mounting-accuracy measuring operation following the commencement of the operation thereof, and uses the thus measured X and Y coordinates ($X_{center}$, $Y_{center}$) in each of subsequent accuracy measuring operations. Alternatively, the mounting system may be so modified as to measure the rotation-center-position coordinates ($X_{center}$, $Y_{center}$) in every n-th (n is greater than 1) accuracy measuring operation, or at a frequency which changes as time elapses. Moreover, the mounting system may be so modified that after the amount of correction of the proper set of rotation-center-position coordinates ($X_{center}$, $Y_{center}$) gradually decreases down to below a reference value, the system does not any longer measure the rotation-center-position coordinates ($X_{center}$, $Y_{center}$).

According to the principle of the present invention, it is not essentially required to measure the relative position of the suction nozzle 62 relative to the EC camera 68 or the F-mark camera 66. Rather, it is possible to measure only the relative position, and relative, angular phase, between the EC camera 68 and the F-mark camera 66, by the medium of the standard chip 100. In the latter case, the EC camera 68 may take a single image of the chip 100 held by the nozzle 62, and the control device 110 may determine the X and Y coordinates of the center position, and the angular phase, of the chip 100 in the X-Y coordinate plane prescribed for the field of view 150 of the camera 68, so that after the X-axis-direction and Y-axis-direction positional errors and angular-phase error of the chip 100 are corrected, the chip 100 is placed at the chip-place position 102. Thus, the center position of the chip 100 should have been coincided with the center position of the field of view 150 of the F-mark camera 66, and the angular phase of the lengthwise axis of the chip 100 should have been coincided with the Y axis of the X-Y coordinate plane. Therefore, the positional error, and angular-phase error, of the center position of the chip 100 present in the image taken by the camera 66 are respective errors from the last proper relative position, and last proper relative angular phase, between the EC camera 68 and the F-mark camera 66. That is, the last proper relative position between the EC camera 68 and the F-mark camera 66 contain the proper relative position between the suction nozzle 62 and the EC camera 68. Thus, in this manner, too, the EC mounting system can measure a mounting accuracy thereof.

In the illustrated embodiment, the control device 110 carries out the mounting-accuracy measuring program, represented by the flow charts of FIGS. 8 to 12, independent of the main control program, i.e., the EC mounting program. However, the entirety of the mounting-accuracy measuring program may be incorporated into the EC mounting program. Alternatively, a portion of the measuring program that is used to monitor the timing at which the control device 110 should start the measuring program may be incorporated into the EC mounting program. In the latter case, a signal which is produced by the incorporated portion is used to start the measuring program.

In the illustrated embodiment, the EC mounting system employs the mounting head 60 which has the single suction nozzle 62, and measures the relative position of the single nozzle 62 relative to each of the EC camera 68 and the F-mark camera 66. However, the mounting head 60 may employ a rotatable table which is rotatable about an axis line and supports a plurality of suction nozzles, each at a predetermined distance from the axis line, such that the suction nozzles are equiangularly spaced from each other about the axis line, and the EC mounting system may measure the relative position of each of the suction nozzles relative to each of the EC camera 68 and the F-mark camera 66.

Figure 9:
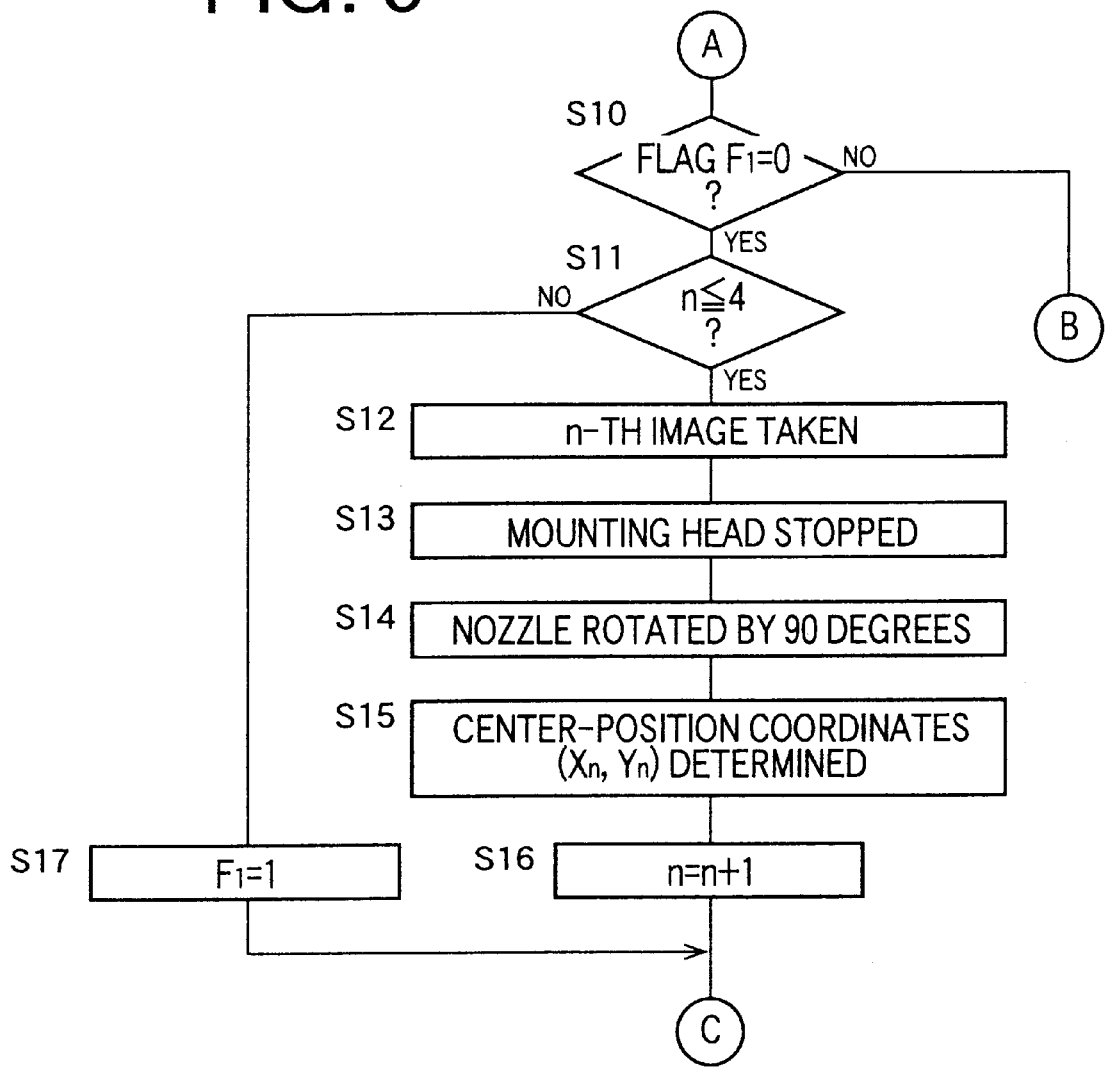
FIG. 9 is a flow chart representing a second portion of the mounting-accuracy measuring program of FIG. 8.
Figure 10:
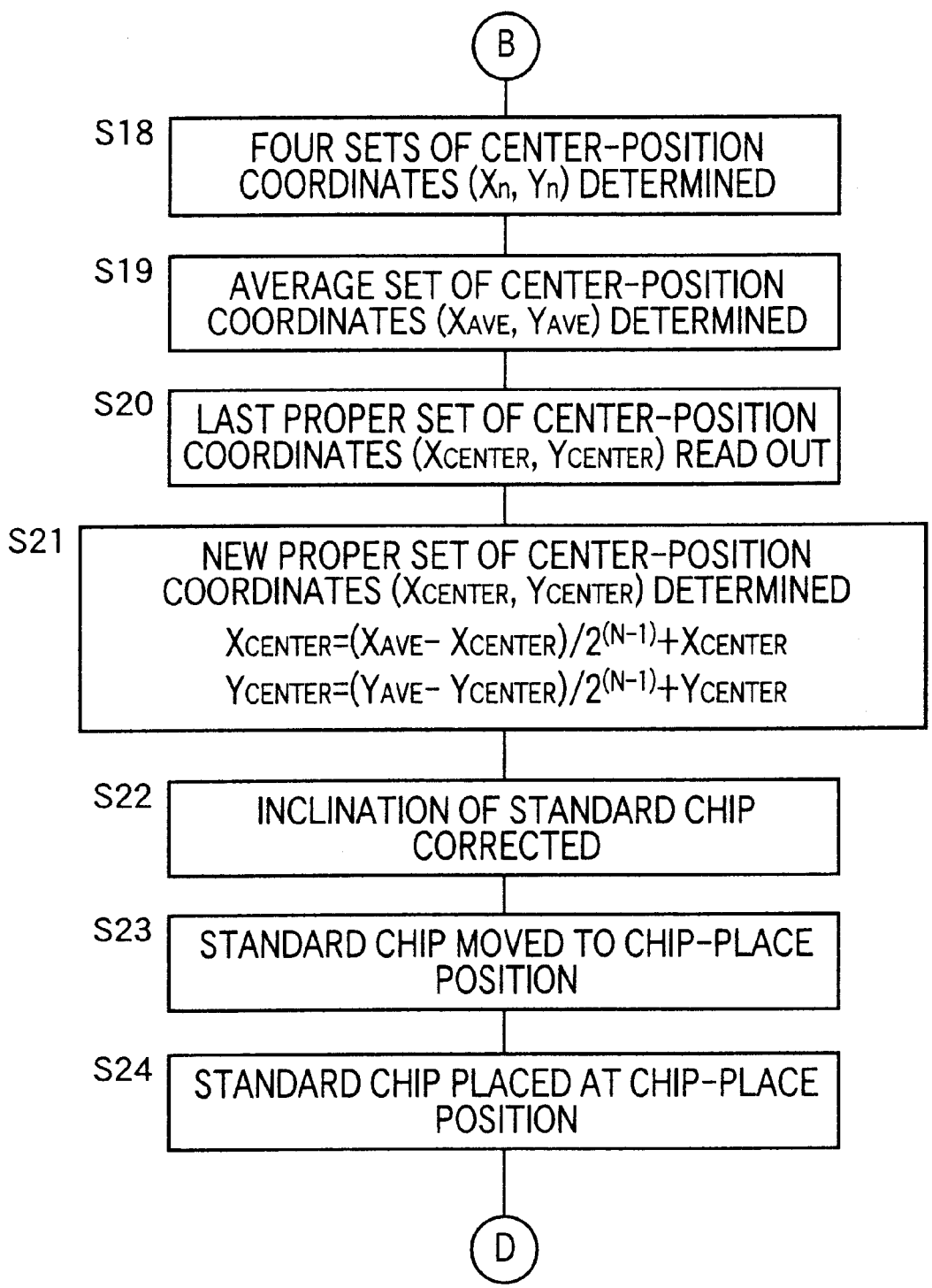
FIG. 10 is a flow chart representing a third portion of the mounting-accuracy measuring program of FIG. 8.
Figure 11:
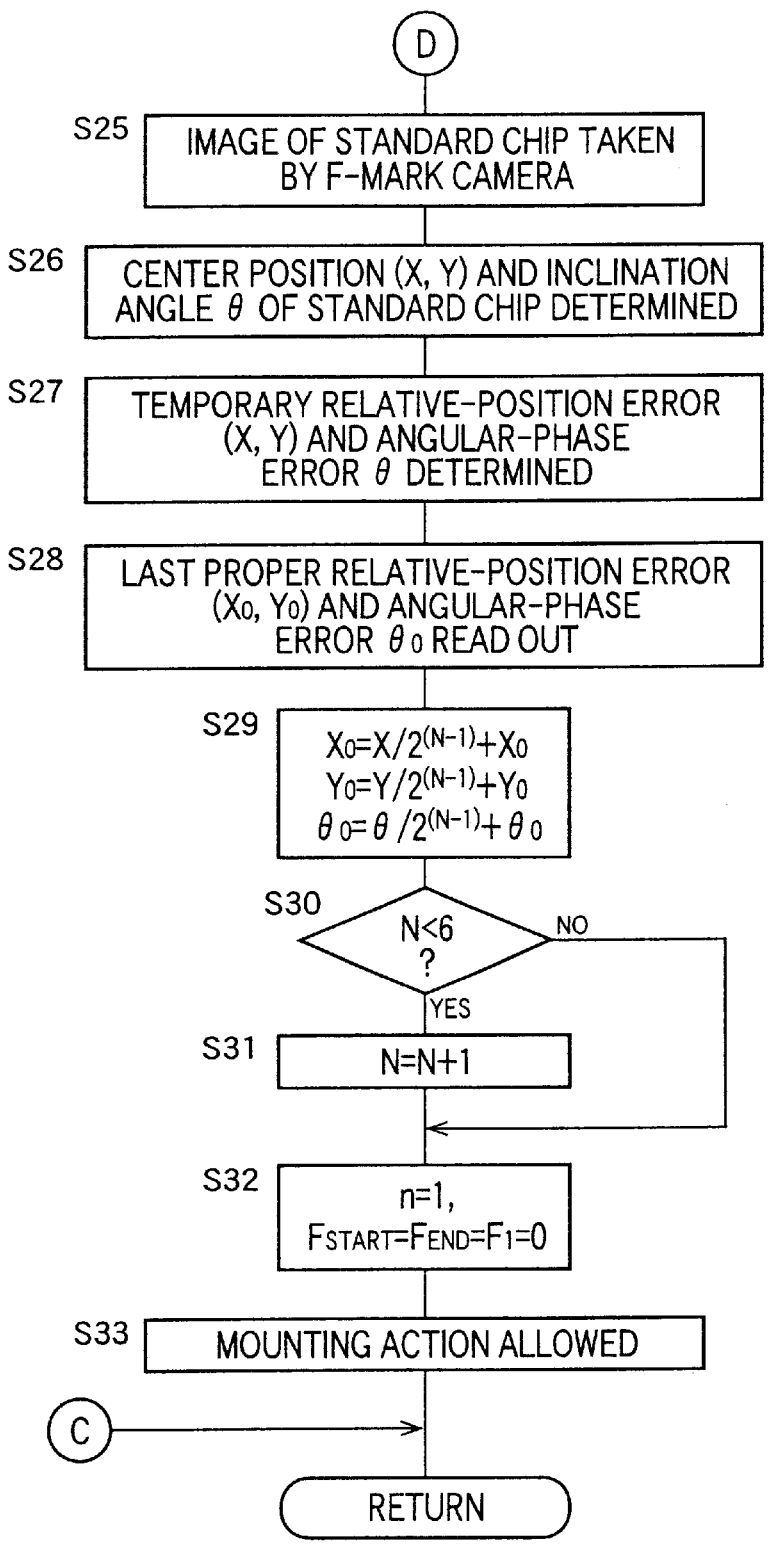
FIG. 11 is a flow chart representing a fourth portion of the mounting-accuracy measuring program of FIG. 8.

Next, there will be described a second embodiment of the present invention in which the first image-taking step represented by the flow chart of FIG. 9 is replaced with a first image-taking step represented by the flow chart shown in FIG. 12. In the second embodiment, the first image-taking step is carried out in such a manner that the mounting head 60 remains stopped at the first image-take position and there the suction nozzle 62 holding the standard chip 100 is rotated from 0 degree to 90 degrees, 180 degrees, and 270 degree while respective images of the chip 100 at the four rotation positions of the nozzle 62 are taken by the EC camera 68. In this case, the timing at which each image of the chip 100 is taken by the camera 68 is controlled by an electronic shutter which is provided by the control device 110. That is, the electronic shutter or the control device 110 eliminates all the electric charges which have been charged to the respective image-take elements (i.e., the respective CCDs) of the camera 68. Each time the camera 68 starts taking an image of the chip 100, the electronic shutter eliminates all the electric charges of respective image-take elements of the camera 68 and then exposes those elements to the image-forming light for a predetermined time (e.g., one hundredth second). Thus, the camera 68 takes the image of the chip 100. Hereinafter, the first image-taking step will be described in detail by reference to the flow chart of FIG. 12.

At Step S110, the control device 110 judges whether the first image-take flag $F_1$ is set at F=0; and at Step S111, the control device 110 judges whether the image-take number n indicating the n-th image-taking action is not greater than 4. If in the current control cycle the number n is equal to 1, that is, the current image-taking action is the first action, a positive judgment is made at Step S111 and the control goes to Step S112 to take the n-th (n=1) image of the chip 100. Step S112 is followed by Step S113 to store, in the RAM 116 of the computer, an n-th batch of image data representing the n-th image of the chip 100. At Step S114, the control device 114 processes the n-th batch of image data and determine the X and Y coordinates ($X_n$, $Y_n$) of the center position of the chip 100 present in the n-th image of the chip 100.

At Step S115, the control device 110 operates for rotating the suction nozzle 62 by 90 degrees; and at Step S116, the control device 110 adds one to the number n to thereby update the number n. Thus, one control cycle according to this program is terminated. Steps S112 to S116 are repeated four times so that the four images of the standard chip 100 are taken by the EC camera 68. In the next control cycle according to this program, a negative judgment is made at Step S111, and the control goes to Step S117 to set the flag $F_1$ to $F_1$=1. In each of the subsequent control cycles, the control devices 110 skips Steps S111 to S117.

Figure 12:
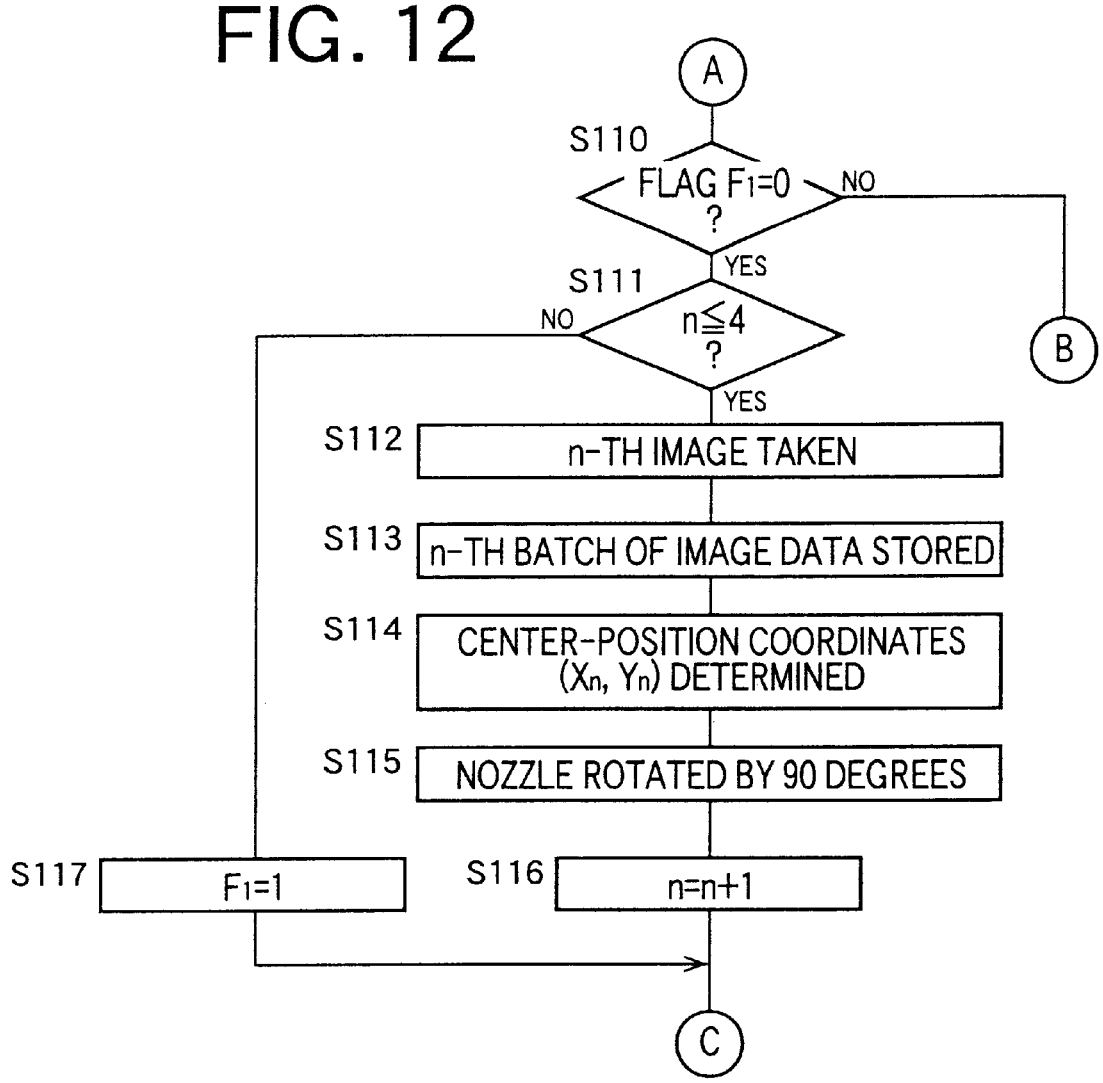
FIG. 12 is a flow chart corresponding to FIG. 9 and representing a portion of another mounting-accuracy measuring program according to which the control device of FIG. 5 may control the EC mounting system of FIG. 1 in a second embodiment of the present invention.
Figure 13:
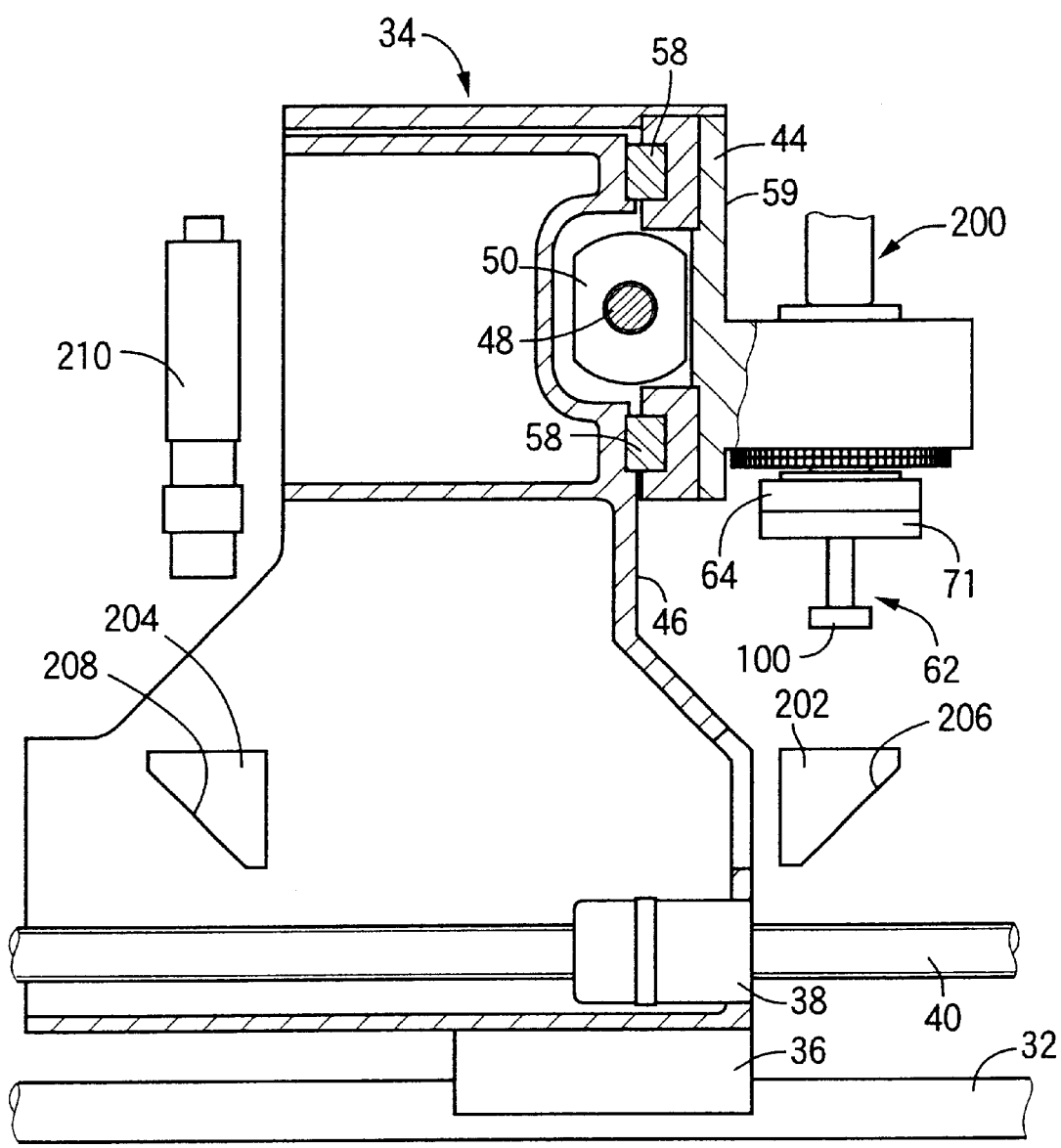
FIG. 13 is a cross-sectioned, side elevation view corresponding to FIG. 4 and showing a mounting head of another EC mounting system as a third embodiment of the present invention.

In each of the first embodiment illustrated in FIGS. 1 to 11 and the second embodiment illustrated in FIG. 12, the mounting head 60 (or the suction nozzle 62), the EC camera 68, and the F-mark camera 66 are movable as a unit in each of the X-axis direction and the Y-axis direction. However, the principle of the present invention is applicable to an EC mounting system in which an EC camera is fixedly provided on an X-axis slide. FIG. 13 shows a third embodiment which relates to the latter EC mounting system.

In the third embodiment, a Y-axis slide 44 has a vertical surface 59 which supports a mounting head 200 such that the head 200 is not movable relative to the Y-axis slide 44. The mounting head 200 includes a nozzle holder 64 which is vertically movable, and a suction nozzle 62 is attached to the nozzle holder 64 such that the suction nozzle 62 is detachable from the holder 64. The suction nozzle 62 applies a negative air pressure to the EC 28 or the standard chip 100 and thereby holds the EC 28 or the chip 100. The mounting head 200 additionally includes an F-mark camera 66 which is immovable relative thereto. Reference numeral 72 designates a back light. Two pairs of reflecting mirrors 202, 204 each as a reflecting device are fixed to an X-axis slide 34 via respective brackets (not shown). The two pairs of reflecting mirrors 202, 204 have a same construction. One reflecting mirror 202 of each pair of mirrors 202, 204 has a first reflecting surface 206 which is inclined, right below a path of movement of the mounting head 200 in the Y-axis direction, by about 45 degrees relative to a vertical plane including the centerline (i.e., axis line) of the suction nozzle 62, and whose lower end is nearer to the X-axis slide 34 than an upper end thereof. On the other hand, the other reflecting mirror 204 has a second reflecting surface 208 which is provided on the other side of the X-axis slide 34 that is opposite to the one reflecting mirror 202, such that the second reflecting surface 208 is symmetrical with the first reflecting surface 206 with respect to the vertical plane and a lower end of the surface 208 is nearer to the X-axis slide 34 than an upper end thereof. The two pairs of reflecting mirrors 202, 204 are provided at respective positions above two ball screws 40 for moving the X-axis slide 34, such that one pair of mirrors 202, 204 are located between the feeder-type EC supplying device 22 and the board positioning and supporting device or the printed board 16, and the other pair of mirrors 202, 204 are located between the tray-type EC supplying device 22 and the printed board 16. An EC camera 210 which takes an image of the EC 28 or the standard chip 100 held by the suction nozzle 62 is fixed to the X-axis slide 34, such that the EC camera 210 is opposed to the second reflecting surface 208 of the second reflecting mirror 204, on the other side of the slide 34 that is opposite to the mounting head 200.

In the EC mounting system shown in FIG. 13, the relative position of the EC camera 210 relative to each of the suction nozzle 62 and the F-mark camera 66 is not fixed in the Y-axis direction, and accordingly the relative position between the camera 210 and each of the nozzle 62 and the camera 66 may time-wise change because of, e.g., the change of temperature. Therefore, it is preferred that the present EC mounting system periodically measure the relative position of the EC camera 210 relative to the suction nozzle 62 or the F-mark camera 66.

In addition, the present invention is applicable to an EC mounting system, shown in FIG. 14, in which an EC camera 250 is fixedly provided on a base 10 such that the EC camera 250 is oriented upward, and a suction nozzle 62 and an F-mark camera 66 are movable as a unit in each of the X-axis and Y-axis directions. In this fourth embodiment, too, the relative position of the EC camera 250 relative to each of the suction nozzle 62 and the F-mark camera 66 is not fixed in the X-axis direction and/or the Y-axis direction, and accordingly the relative position between the camera 250 and each of the nozzle 62 and the camera 66 may time-wise change because of, e.g., the change of temperature. Therefore, it is preferred that the present EC mounting system periodically measure the relative position of the EC camera 250 relative to the suction nozzle 62 or the F-mark camera 66.

Moreover, the present invention is applicable to an "index-type" EC mounting system, as shown in FIG. 15, which includes an index table 306 which is intermittently rotatable about a vertical axis line and is immovable relative to a base 354. The index table 306 supports a plurality of suction nozzles 62 each of which is for sucking and holding an EC 28. The EC mounting system further includes a printed-board positioning and supporting device 352 which positions and supports a printed board 16 and includes an X-Y table 350 for moving the printed board 16 in each of the X-axis and Y-axis directions in the horizontal plane parallel to the upper surface of the printed board 16 supported on the table 350, so that an EC mounting device 302 including the index table 306 and the suction nozzles 62 mounts the ECs 28 on predetermined EC-mount places on the printed board 16. The index-type EC mounting system measures its mounting accuracy, in the manner described below.

The present EC mounting system additionally includes an EC supplying device 304. The index table 306 supports the plurality of suction nozzles 62 such that the nozzles 62 are equiangularly spaced from each other about the vertical axis line of the table 306, and is intermittently rotated by an intermittent-rotation device (not shown) including an index servomotor, a cam, a cam follower, a rotary shaft, etc, so that the nozzles 62 are sequentially moved to each of operative positions including an EC-suck position (i.e., an EC-take position), an EC-posture-detect position, an EC-posture-correct position, and an EC-mount position. The EC mounting system carries out various operations for the respective ECs 28 held by the suction nozzles 62 being positioned at the operative positions, so that the ECs 28 are finally mounted on the printed board 16 which is moved by the X-Y table 350.

The EC supplying device 304 includes a feeder-support table 330 and a plurality of EC feeders 24 which are detachably attached to the feeder-support table 330 such that respective EC-supply portions of the EC feeders 24 are arranged along a straight line parallel to the X-axis direction on the horizontal plane. When a ball screw 334 is rotated by an X-axis servomotor 336, the feeder-support table 330 is moved in the X-axis direction while being guided by a pair of guide rails 338, so that the respective EC-supply portions of the EC feeders 24 are sequentially moved to an EC-supply position right below the EC-suck position of the index table 306. The ball screw 334 and the X-axis servomotor cooperate with each other to provide a feeder-support-table moving device 340.

The printed board 16 is supported by the supporting and positioning device 352, and is moved to an arbitrary position on the horizontal, X-Y coordinate plane defined by the X and Y axes. The supporting and positioning device 352 are provided, on the bed 354, with the EC mounting device 302 and the EC supplying device 304, receives the printed board 16 from a carry-in device (not shown), and transfers the board 16 on which the mounting of ECs 28 has been finished, to a carry-out device (not shown). Each of the carry-in and carry-out devices includes a belt conveyor and conveys the printed board 16 in the X-axis direction. The X-Y table 350 includes an X-axis table 362 and a Y-axis table 370 which is provided on the X-axis table 362. The X-axis table 362 is linearly moved in the X-axis direction by being guided by a pair of guide rails 360, when a ball screw 356 which is provided on the bed 354 is rotated by an X-axis servomotor 358. The Y-axis table 370 is linearly moved in the Y-axis direction by being guided by a pair of guide rails 368, when a ball screw 364 is rotated by a Y-axis servomotor 366. A plurality of chip-place positions 102 are determined on the Y-axis table 370, such that the chip-place positions 102 do not interfere with the printed board 16 supported by the X-Y table 350. Each of the servomotors 336, 358, 366 is an electric rotary motor which is accurately controllable with respect to its rotation angle, and may be replaced with a stepper motor. An F-mark camera 372 is fixedly attached to a main frame (not shown) of the present EC mounting system, such that the F-mark camera 372 is oriented downward.

In addition, an EC camera 380 is fixedly supported by a supporting device (not shown), at a position corresponding to the EC-posture-detect position of the index table 306. More specifically described, a light-transmitting device 382 is provided right below the EC-posture-detect position, and extends horizontally along a straight line passing through the EC-posture-detect position and the axis line of rotation of the index table 306. The light-transmitting device 382 includes a pair of reflecting mirrors (not shown) which consists of an input mirror located right below the EC-posture-detect position and an output mirror located outside the index table 306. Thus, the light-transmitting device 382 outputs, from the output mirror, an image-forming light in a vertically upward direction. The EC camera 380 is provided above the output mirror of the light-transmitting device 382, such that the EC camera 380 is oriented in a vertically downward direction. Since the EC camera 380 takes an image which has been reflected two times by the input and output mirrors, respectively, the thus received image is the same as that taken by a camera which directly faces the EC 28 held by each suction nozzle 62. In addition, since the light-transmitting device 382 is provided along a radius of the index table 306, the EC 28 present in the image taken by the EC camera 380 has the same angular phase (i.e., the same rotation position) as that of the EC 28 held by each nozzle 62 being positioned at the EC-mount position of the index table 306.

The EC-posture-detect position is intermediate between the EC-suck position and the EC-mount position, and is near to the EC-suck position. Therefore, in each mounting-accuracy measuring operation of the present EC mounting system, when the EC camera 380 takes an image of the standard chip 100 held by each suction nozzle 62 being positioned at the EC-posture-detect position, an image processing device (not shown) of the mounting system can finish processing image data representing the taken image till the each nozzle 62 reaches the EC-position-correct position of the index table 306.

In the fifth embodiment shown in FIG. 15, the relative position of each of the suction nozzles 62 relative to the EC camera 380 is changed unlike the relative position between the suction nozzle 62 and the EC camera 68 in the first embodiment. Therefore, in each accuracy measuring operation of the present system, each suction nozzle 62 holding the standard chip 100 is rotated to a plurality of rotation positions at each of so which an image of the chip 100 is taken by the EC camera 380, and a relative position between each nozzle 62 and the camera 380 is measured based on the thus taken images.

Moreover, since the index table 306 is not movable relative to the bed 354, the. EC-mount position where each of the suction nozzles 62 mounts the EC 28 on the printed board 16 is fixed, and the X-Y table 350 supporting the board 16 is so moved that each of the EC-mount places on the board 16 is opposed to the EC 28 held by the suction nozzle 62 being positioned at the EC-mount position and the nozzle 62 mounts the EC 28 at the each EC-mount place on the board 16. Likewise, when the standard chip 100 is placed at an appropriate one of the chip-place positions 102, the X-Y table 350 is so moved that the one chip-place position 102 is opposed to the chip 100 held by each suction nozzle 62 being positioned at the EC-mount place and the each nozzle 62 mounts the chip 100 at the one chip-place position. Thus, the present EC mounting system cannot carry out its mounting-accuracy measuring operation while carrying in and carrying out the printed boards 16 each as the circuit substrate. Therefore, the present mounting system carries out its mounting-accuracy measuring operation when one of the EC-feeders 24 on the feeder-support table 330 has supplied all the ECs 28 stored therein and the table 330 should be replaced with a new table 330, or when an electric-circuit pattern assembled on each printed board 16 should be changed to a new pattern. Alternatively, the mounting system may carry out its mounting-accuracy measuring operation by suspending temporarily its EC mounting operation.

It is to be understood that the present invention may be embodied with various other changes, modifications and improvements, such as those described in SUMMARY OF THE INVENTION, which may occur to a person skilled in the art, without departing from the spirit and scope of the invention defined in the appended claims.

What is claimed is:

1. A method of measuring an accuracy with which an electric-component mounting system mounts at least one electric component on a circuit substrate, the electric-component mounting system including at least one component holder for holding said at least one electric component, a substrate supporting device for supporting the circuit substrate, a first image-taking device for taking an image of at least a portion of the electric component held by the component holder, and a second image-taking device for taking an image of at least a portion of the circuit substrate supported by the substrate supporting device, the component holder, the first image-taking device and the second image-taking device relating to said accuracy, the method comprising the step of measuring, with the electric-component mounting system, at least one positional error of one of the component holder, the first image-taking device and the second image-taking device relative to each one of the others of the component holder and the first and second image-taking devices.

2. A method according to claim 1, wherein the step of measuring said at least one positional error comprises measuring, while the electric-component mounting system is performing an electric-component mounting operation, said at least one positional error of said one of the component holder and the first and second image-taking devices relative to said each one of the others of the component holder and the first and second image-taking devices, by using a plurality of portions of the mounting system that can be used without lowering an operation efficiency with which the mounting system performs said electric-component mounting operation, said plurality of portions of the mounting system comprising the component holder and the first and second image-taking devices.

3. A method according to claim 1, wherein the step of measuring said at least one positional error comprises measuring, at each one of a plurality of different times, at least one temporary characteristic value relating to said accuracy, and determining, at said each one of the different times, at least one proper characteristic value based on said at least one temporary characteristic value measured at said each one time and at least one temporary characteristic value measured at at least one of the different times that is prior to said each one time.

4. A method according to claim 1, wherein the step of measuring said at least one positional error comprises measuring, at each one of a plurality of different times while the electric-component mounting system is performing an electric-component mounting operation, at least one temporary characteristic value comprising said at least one positional error of said one of the component holder and the first and second image-taking devices relative to said each one of the others of the component holder and the first and second image-taking devices, by using a plurality of portions of the mounting system that can be used without lowering an operation efficiency with which the electric-component mounting system performs said electric-component mounting system, and determining, at said each one of the different times, at least one proper characteristic value based on said at least one temporary characteristic value measured at said each one time and at least one temporary characteristic value measured at least one of the different times that is prior to said each one time, said plurality of portions of the mounting system comprising the component holder and the first and second image-taking devices.

5. A method according to claim 1, wherein the mounting system further includes a base on which said at least one component holder, the substrate supporting device, the first image-taking device and the second image-taking device are provided, and wherein the step of measuring said at least one positional error comprises operating the component holder to hold a standard chip, operating the first image-taking device to take at least one first image of at least a portion of the standard chip held by the component holder, operating the component holder to place the standard chip at a chip-place position prescribed on a member provided on the base, operating the second image-taking device to take at least one second image of at least a portion of the standard chip placed at the chip-place position, and determining, based on first image data representing the first image taken by the first image-taking device and second image data representing the second image taken by the second image-taking device, said at least one positional error of said one of the component holder, the first image-taking device and the second image-taking device relative to said each one of the others of the component holder and the first and second image-taking devices.

6. A method of measuring an accuracy with which an electric-component mounting system mounts at least one electric component on a circuit substrate, the electric-component mounting system including at least one component holder for holding said at least one electric component, a substrate supporting device for supporting the circuit substrate, a first image-taking device for taking an image of at least a portion of the electric component held by the component holder, and a second image-taking device for taking an image of at least a portion of the circuit substrate supported by the substrate supporting device, the component holder, the first image-taking device and the second image-taking device relating to said accuracy, the method comprising the steps of operating the component holder to hold a standard chip, operating the first image-taking device to take at least one first image of at least a portion of the standard chip held by the component holder, operating the component holder to place the standard chip at a prescribed chip-place position, operating the second image-taking device to take at least one second image of at least a portion of the standard chip placed at the chip-place position, and determining, based on first image data representing the first image taken by the first image-taking device and second image data representing the second image taken by the second image-taking device, at least one positional error of one of the component holder, the first image-taking device and the second image-taking device relative to each one of the others of the component holder and the first and second image-taking devices.

7. A method according to claim 6, wherein the step of determining said at least one positional error comprises determining, based on the first image taken by the first image-taking-device, at least one positional error of the standard chip held by the component holder, relative to each one of the component holder and the first image-taking device, and determining, based on the second image taken by the second image-taking device, at least one positional error of the second image-taking device relative to the standard chip placed at the chip-place position.

8. A method according to claims 6, wherein the step of determining said at least one positional error comprises determining at least one positional error of the second image-taking device relative to each one of the component holder and the first image-taking device.

9. A method according to claim 6, the step of determining said at least one positional error comprises determining at least one positional error of the standard chip relative to the component holder, and modifying, based on the determined positional error of the standard chip relative to the component holder, prescribed control data used to operate the component holder to place the standard chip at the prescribed chip-place position, so that the component holder is operated, according to the modified control data, to place the standard chip at the chip-place position.

10. A method according to claim 6, wherein the step of measuring said at least one positional error further comprises placing, before the component holder is operated to hold the standard chip, the standard chip at the prescribed chip-place position, so that the component holder is operated to hold the standard chip placed at the chip-place position.

11. A method according to claim 6, wherein the step of measuring said at least one positional error further comprises prescribing a plurality of chip-place positions which are distant from each other in a direction which is parallel to a surface of the circuit substrate supported by the substrate supporting device and in which a moving device moves at least one of the component holder and the circuit substrate relative to the other of the component holder and the circuit substrate.

12. A method according to claim 11, wherein the mounting system further includes a base on which said at least one component holder, the substrate supporting device, the moving device, the first image-taking device and the second image-taking device are provided, and wherein the step of measuring said at least one positional error further comprising prescribing the plurality of chip-place positions on a member which is provided on the base.

13. A method according to claim 6, wherein the step of operating the first image-taking device to take said at least one first image comprises rotating the component holder holding the standard chip, about an axis line of the holder, to each of a plurality of rotation positions of the holder, and operating the first image-taking device to take a first image of the standard chip held by the component holder at each of the rotation positions thereof, and wherein the step of determining said at least one positional error comprises determining, based on the respective first images taken by the first image-taking device at the rotation positions of the holder, at least one positional error of the standard chip relative to the component holder.

14. A method according to claim 13, wherein the step of determining said at least one positional error of the standard chip relative to the component holder comprises determining, as a position of the component holder, a position of a center of a circle which passes through respective positions of respective centers of the standard chips present in the respective first images taken by the first image-taking device at the rotation positions of the holder.

15. A method according to claim 13, wherein the plurality of rotation positions of the component holder are equiangularly spaced from each other about the axis line of the holder, and wherein the step of determining said at least one positional error of the standard chip relative to the component holder comprises determining, as a position of the component holder, an average of respective positions of respective centers of the standard chips present in the respective first images taken by the first image-taking device at the rotation positions of the holder.

16. A method of measuring an accuracy with which an electric-component mounting system mounts at least one electric component on each of a plurality of circuit substrates, the electric-component mounting system including at least one component holder for holding said at least one electric component, a substrate supporting device for supporting said each of the circuit substrates such that said each circuit substrate is not movable relative thereto, a moving device for moving the component holder holding the electric component, in a direction parallel to a surface of said each circuit substrate supported by the substrate supporting device, so that the electric component is mounted on said each circuit substrate, a first image-taking device, and a second-image taking device, the method comprising the step of measuring, while the electric-component mounting system is performing an electric-component mounting operation, the accuracy with which the mounting system mounts said at least one electric component on said each of the circuit substrates, by using a plurality of portions of the mounting system that can be used without lowering an operation efficiency with which the mounting system performs said electric-component mounting operation, wherein the step of measuring said accuracy comprises operating, after the electric-component mounting system has finished, in said electric-component mounting operation, a mounting operation on a first circuit substrate supported by the substrate supporting device and while the mounting system is continuing said electric-component mounting operation including carrying out the first circuit substrate from the substrate supporting device and carrying in a second circuit substrate to the supporting device, the component holder to hold a standard chip, operating the first image-taking device to take at least one first image of at least a portion of the standard chip held by the component holder, operating the component holder to place the standard chip at a prescribed chip-place position, and operating the second image-taking device to take at least one second image of at least a portion of the standard chip placed at the chip-place position, and determining, based on first image data representing the first image taken by the first image-taking device, at least one positional error of the standard chip held by the component holder, relative to each one of the component holder and the first image-image taking device, and determining, based on second image data representing the second image taken by the second image-taking device, at least one positional error of the second image-taking device relative to the standard chip placed at the chip-place position, said plurality of portions of the mounting system comprising the component holder and the first and second image-image taking devices.

17. A method according to claim 16, wherein the chip-place position is prescribed at a position on the substrate supporting device such that the standard chip placed at the prescribed chip-place position does not interfere with the circuit substrate supported by the substrate supporting device.

18. A method according to claim 16, wherein the chip-place position is prescribed at a position on a portion of the substrate supporting device that is immovable at least while the electric-component mounting system is performing said electric-component mounting operation.

19. A method of measuring an accuracy with which an electric-component mounting system mounts at least one electric component on each of a plurality of circuit substrates, the electric-component mounting system including at least one component holder for holding said at least one electric component and mounting the electric component on said each of the circuit substrates, the method comprising the steps of measuring, at each one of a plurality of different times, at least one temporary characteristic value relating to the accuracy with which the electric-component mounting system mounts said at least one electric component on said each circuit substrate; and determining, at said each one of the different times, at least one proper characteristic value based on said at least one temporary characteristic value measured at said each one time and at least one temporary characteristic value measured at at least one of the different times that is prior to said each one time.

20. A method according to claim 19, wherein the step of measuring said at least one temporary characteristic value comprises measuring said at least one temporary characteristic value, at said each one time after the electronic-component mounting system has finished a mounting operation on a first circuit substrate and before the mounting system starts a mounting operation on a second circuit substrate following the first circuit substrate.

21. A method according to claim 19, wherein the step of determining said at least one proper characteristic value comprises determining, at said each one of the times, said at least one proper characteristic value based on said at least one temporary characteristic value measured at said each one time, at least one proper characteristic value determined at one of the different times that precedes said each one time, and a total number of the different times up to said each one time.

22. A method according to claim 19, wherein the step of measuring said at least one temporary characteristic value comprises measuring, while the electric-component mounting system is performing an electric-component mounting operation, said at least one temporary characteristic value, by using at least one portion of the mounting system that can be used without lowering an operation efficiency with which the mounting system performs said electric-component mounting operation, said at least one portion of the mounting system comprising the component holder.

23. A method of measuring an accuracy with which an electric-component mounting system mounts at least one electric component on a circuit substrate, the electric-component mounting system including at least one component holder for holding said at least one electric component, a substrate supporting device for supporting the circuit substrate, a first image-taking device for taking an image of at least a portion of the electric component held by the component holder, and a second image-taking device for taking an image of at least a portion of the circuit substrate supported by the substrate supporting device, the method comprising the steps of operating the component holder to hold a standard chip, operating the first image-taking device to take at least one first image of at least a portion of the standard chip held by the component holder, operating the component holder to place the standard chip at a prescribed chip-place position, operating the second image-taking device to take at least one second image of at least a portion of the standard chip placed at the chip-place position, determining, based on image data representing the first image taken by the first image-taking device and image data representing the second image taken by the second image-taking device, a relative angular error between respective angular phases of the first and second image-taking devices about respective optical axes thereof.

24. A recording medium in which an accuracy measuring program is recorded such that the accuracy measuring program is readable by a computer to control an electric-component mounting system to measure an accuracy with which the mounting system mounts at least one electric component on a circuit substrate, the mounting system including at least one component holder for holding the electric component and mounting the electric component on the circuit substrate, the accuracy measuring program comprising the steps of controlling the component holder to hold a standard chip, controlling a first image-taking device to take at least one first image of at least a portion of the standard chip held by the component holder, moving the component holder to a prescribed chip-place position and place the standard chip at the chip-place position, controlling a second image-taking device to take at least one second image of at least a portion of the standard chip placed at the chip-place position, determining, based on image data representing the first image taken by the first image-taking device, at least one first relative positional error between the standard chip and at least one of the component holder and the first image-taking device, and determining, based on image data representing the second image taken by the second image-taking device, at least one second relative positional error between the standard chip and the second image-taking device.

25. A recording medium according to claim 24, wherein the accuracy measuring program further comprises modifying, based on the determined first and second relative positional errors, an electric-component mounting program which is used to control the electric-component mounting system to mount the electric component on the circuit substrate.

26. An electric-component mounting system, comprising:

at least one component holder which is for holding at least one electric component and mounting the electric component on a circuit substrate;

a moving device which is for moving at least one of the component holder and the circuit substrate relative to the other of the component holder and the circuit substrate, in a direction parallel to a surface of the circuit substrate;

a first image-taking device which is for taking an image of at least a portion of the electric component held by the component holder;

a second image-taking device which is for taking an image of at least a portion of the circuit substrate; and a control device which controls the component holder, the moving device, and the first and second image-taking devices so that the electric component is mounted on the circuit substrate, the control device comprising a measurement control portion which controls the component holder to hold a standard chip, controls the first image-taking device to take at least one first image of at least a portion of the standard chip held by the component holder, controls the component holder to place the standard chip at a prescribed chip-place position, controls the second image-taking device to take at least one second image of at least a portion of the standard chip placed at the chip-place, position, determines, based on image data representing the first image taken by the first image-taking device, at least one first relative positional error between the standard chip and at least one of the component holder and the first image-taking device, and determines, based on image data representing the second image taken by the second image-taking device, at least one second relative positional error between the standard chip and the second image-taking device.

27. A system according to claim 26, further comprising a base on which said at least one component holder, the moving device, the first image-taking device and the second image-taking device are provided; and a member which is provided on the base and on which the chip-place position is prescribed.

* * * * *